United States Patent
Kikuchi et al.

(10) Patent No.: US 10,283,710 B2
(45) Date of Patent: May 7, 2019

(54) RESISTIVE RANDOM ACCESS MEMORY DEVICE CONTAINING REPLACEMENT WORD LINES AND METHOD OF MAKING THEREOF

(71) Applicant: SANDISK TECHNOLOGIES LLC, Plano, TX (US)

(72) Inventors: Shin Kikuchi, Yokkaichi (JP); Seje Takaki, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/695,225

(22) Filed: Sep. 5, 2017

(65) Prior Publication Data
US 2019/0074441 A1 Mar. 7, 2019

(51) Int. Cl.
*H01L 27/24* (2006.01)
*H01L 45/00* (2006.01)
*G11C 13/00* (2006.01)

(52) U.S. Cl.
CPC ........ *H01L 45/1683* (2013.01); *H01L 27/249* (2013.01); *H01L 27/2454* (2013.01); *H01L 45/085* (2013.01); *H01L 45/1246* (2013.01); *H01L 45/1253* (2013.01); *H01L 45/146* (2013.01); *G11C 13/0026* (2013.01); *G11C 13/0028* (2013.01)

(58) Field of Classification Search
CPC ............. H01L 45/1683; H01L 45/1246; H01L 45/146; H01L 45/1253; H01L 45/085; H01L 27/2454; H01L 27/249
See application file for complete search history.

(56) References Cited

U.S. PATENT DOCUMENTS

| 5,915,167 A | * | 6/1999 | Leedy ...................... G11C 5/02 257/E21.597 |
| 8,349,681 B2 | * | 1/2013 | Alsmeier .......... H01L 27/11551 438/216 |

(Continued)

FOREIGN PATENT DOCUMENTS

| WO | WO 2007/004843 A1 | 1/2007 |
| WO | WO2017155668 A1 | 9/2017 |

OTHER PUBLICATIONS

U.S. Appl. No. 15/251,818, filed Aug. 30, 2016, SanDisk Technologies LLC.

(Continued)

*Primary Examiner* — Earl N Taylor
(74) *Attorney, Agent, or Firm* — The Marbury Law Group PLLC

(57) ABSTRACT

A method of forming a resistive memory device includes forming an alternating stack of insulating layers and sacrificial material layers that extend along a first horizontal direction over a substrate, forming a laterally alternating sequence of vertical conductive lines and dielectric pillar structures that alternate along the first horizontal direction on sidewalls of the alternating stack, forming lateral recesses by removing the sacrificial material layers selective to the insulating layers, selectively growing resistive memory material portions from physically exposed surfaces of the vertical conductive lines in the lateral recesses, and forming electrically conductive layers over the resistive memory material portions in the lateral recesses.

10 Claims, 31 Drawing Sheets

(56) References Cited

U.S. PATENT DOCUMENTS

| | | | |
|---|---|---|---|
| 9,230,983 B1* | 1/2016 | Sharangpani | H01L 27/11524 |
| 9,343,507 B2 | 5/2016 | Takaki | |
| 9,397,046 B1* | 7/2016 | Sharangpani | H01L 27/1157 |
| 9,437,658 B2* | 9/2016 | Sakotsubo | H01L 45/1253 |
| 9,576,975 B2* | 2/2017 | Zhang | H01L 27/11582 |
| 9,620,712 B2* | 4/2017 | Hayashi | H01L 45/04 |
| 9,666,799 B2* | 5/2017 | Yanagida | H01L 45/141 |
| 9,704,920 B2* | 7/2017 | Bandyopadhyay | H01L 27/2409 |
| 9,806,256 B1* | 10/2017 | Wu | H01L 45/124 |
| 9,818,801 B1* | 11/2017 | Rabkin | H01L 27/11582 |
| 9,911,790 B1* | 3/2018 | Shimabukuro | H01L 27/249 |
| 9,953,697 B2* | 4/2018 | Kumar | G11C 11/4091 |
| 9,985,098 B2* | 5/2018 | Matsumoto | H01L 27/11524 |
| 2008/0073635 A1* | 3/2008 | Kiyotoshi | H01L 27/105 257/2 |
| 2008/0200003 A1* | 8/2008 | Hong | B82Y 30/00 438/384 |
| 2013/0043455 A1* | 2/2013 | Bateman | H01L 27/2454 257/5 |
| 2013/0248801 A1* | 9/2013 | Yamamoto | H01L 27/249 257/4 |
| 2015/0255512 A1* | 9/2015 | Takagi | H01L 45/146 257/4 |
| 2015/0263074 A1* | 9/2015 | Takaki | H01L 27/2481 257/5 |
| 2016/0126292 A1 | 5/2016 | Yanagida et al. | |
| 2016/0126455 A1* | 5/2016 | Hayashi | H01L 45/04 257/2 |
| 2016/0225866 A1* | 8/2016 | Peri | H01L 29/66833 |
| 2017/0077184 A1* | 3/2017 | Kikuchi | H01L 27/2436 |
| 2017/0117324 A1* | 4/2017 | Bandyopadhyay | H01L 27/2409 |
| 2017/0221559 A1* | 8/2017 | Chen | G11C 13/0007 |
| 2017/0236873 A1* | 8/2017 | Chen | H01L 45/1233 438/382 |
| 2017/0250224 A1* | 8/2017 | Ratnam | H01L 23/528 |
| 2017/0309324 A1* | 10/2017 | Kumar | G11C 11/4091 |
| 2017/0317140 A1* | 11/2017 | Wicklein | H01L 27/2454 |
| 2018/0122904 A1* | 5/2018 | Matsumoto | H01L 27/11524 |

OTHER PUBLICATIONS

U.S. Appl. No. 15/299,919, filed Oct. 21, 2016, SanDisk Technologies LLC.

U.S. Appl. No. 15/581,078, filed Apr. 28, 2017, SanDisk Technologies LLC.

U.S. Appl. No. 15/611,029, filed Jun. 1, 2017, SanDisk Technologies LLC.

U.S. Appl. No. 15/635,935, filed Jun. 28, 2017, SanDisk Technologies LLC.

International Search Report and Written Opinion of the International Search Authority for International Patent Application No. PCTUS2018/034697, dated Sep. 10, 2018, 13 pages.

* cited by examiner

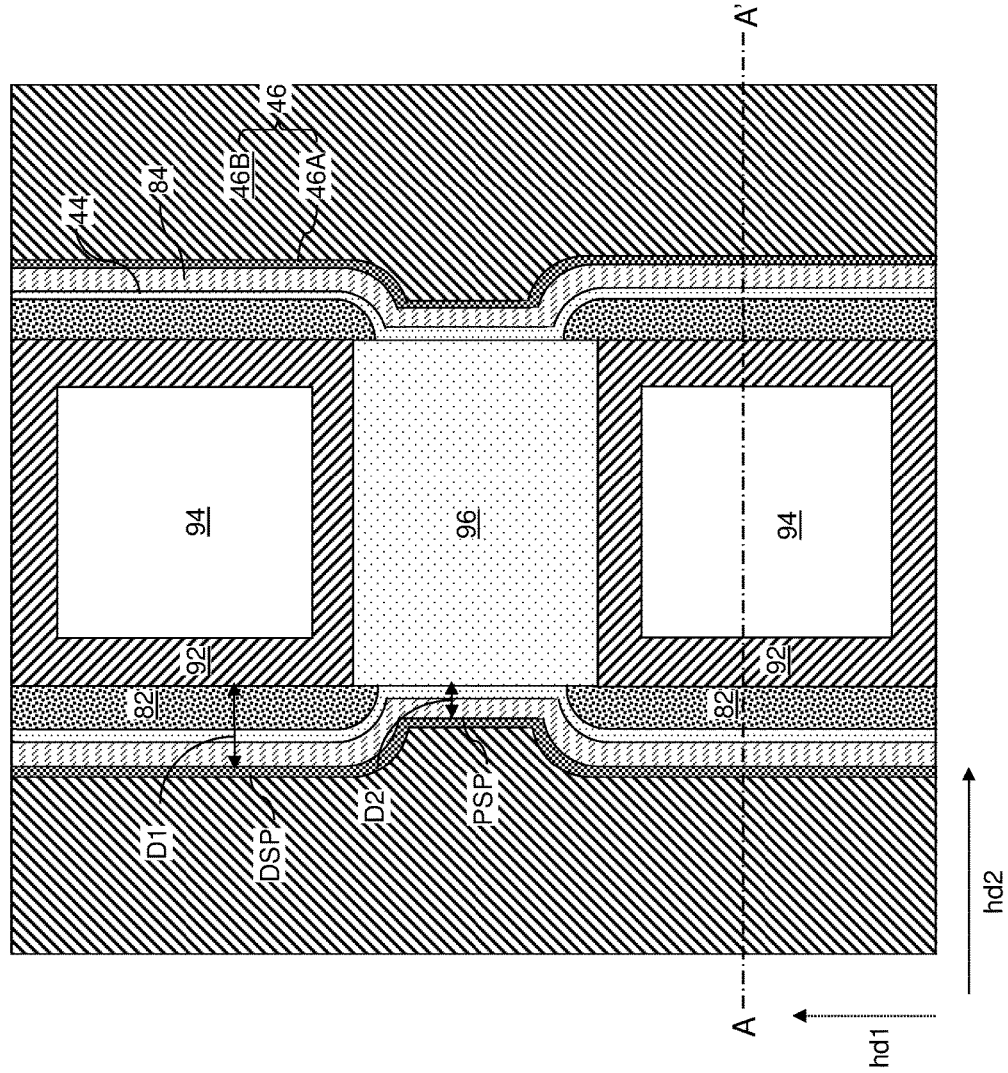

RESISTIVE RANDOM ACCESS MEMORY DEVICE CONTAINING REPLACEMENT WORD LINES AND METHOD OF MAKING THEREOF

FIELD

The present disclosure relates generally to the field of semiconductor devices, and specifically to a resistive random access memory device containing replacement word line electrodes and methods of manufacturing the same.

BACKGROUND

Resistance Random Access Memory, or "ReRAM," is a non-volatile memory device employing reversible change in resistance in a thin film with application of electrical voltage bias across the film. Thus, data can be stored in a ReRAM cell by changing the resistance of the thin film, which can be a solid-state material. The thin film is referred to as a memory film or a read/write film. Examples of ReRAM devices are described in World Intellectual Property Organization (WIPO) Publication No. WO2007004843 A1 to Hong et al. and U.S. Patent Application Publication No. 2013/0043455 A1 to Bateman.

A resistive memory cell can be programmed into a set state having a low electrical resistance, or a reset state having a high resistance. A write operation stores data in a set of resistive memory cells by programming each resistive memory cell into a set state or a reset state depending on the contents of the data. For example, "1" can correspond to a set state and "0" can correspond to a reset state, or vice versa.

SUMMARY

According to an aspect of the present disclosure, a method of forming a resistive memory device includes forming an alternating stack of insulating layers and sacrificial material layers that extend along a first horizontal direction over a substrate, forming a laterally alternating sequence of vertical conductive lines and dielectric pillar structures that alternate along the first horizontal direction on sidewalls of the alternating stack, forming lateral recesses by removing the sacrificial material layers selective to the insulating layers, selectively growing resistive memory material portions from physically exposed surfaces of the vertical conductive lines in the lateral recesses, and forming electrically conductive layers over the resistive memory material portions in the lateral recesses.

According to another aspect of the present disclosure, a resistive memory device comprises an alternating stack of insulating layers and electrically conductive layers that extend along a first horizontal direction, a laterally alternating sequence of vertical conductive lines and dielectric pillar structures that alternate along the first horizontal direction and contacting sidewalls of the insulating layers, and resistive memory material portions located at intersection regions of the electrically conductive layers and the vertical conductive lines. Each of the electrically conductive layers has a laterally undulating sidewall including proximal sidewall portions adjacent to the dielectric pillar structures and distal sidewall portions adjacent to the vertical conductive lines.

BRIEF DESCRIPTION OF THE DRAWINGS

FIG. 13B is a horizontal cross-sectional view along the B-B' plane of FIG. 13A. The vertical plane A-A' is the plane of the vertical cross-section of FIG. 13A.

DETAILED DESCRIPTION

Figure 1:
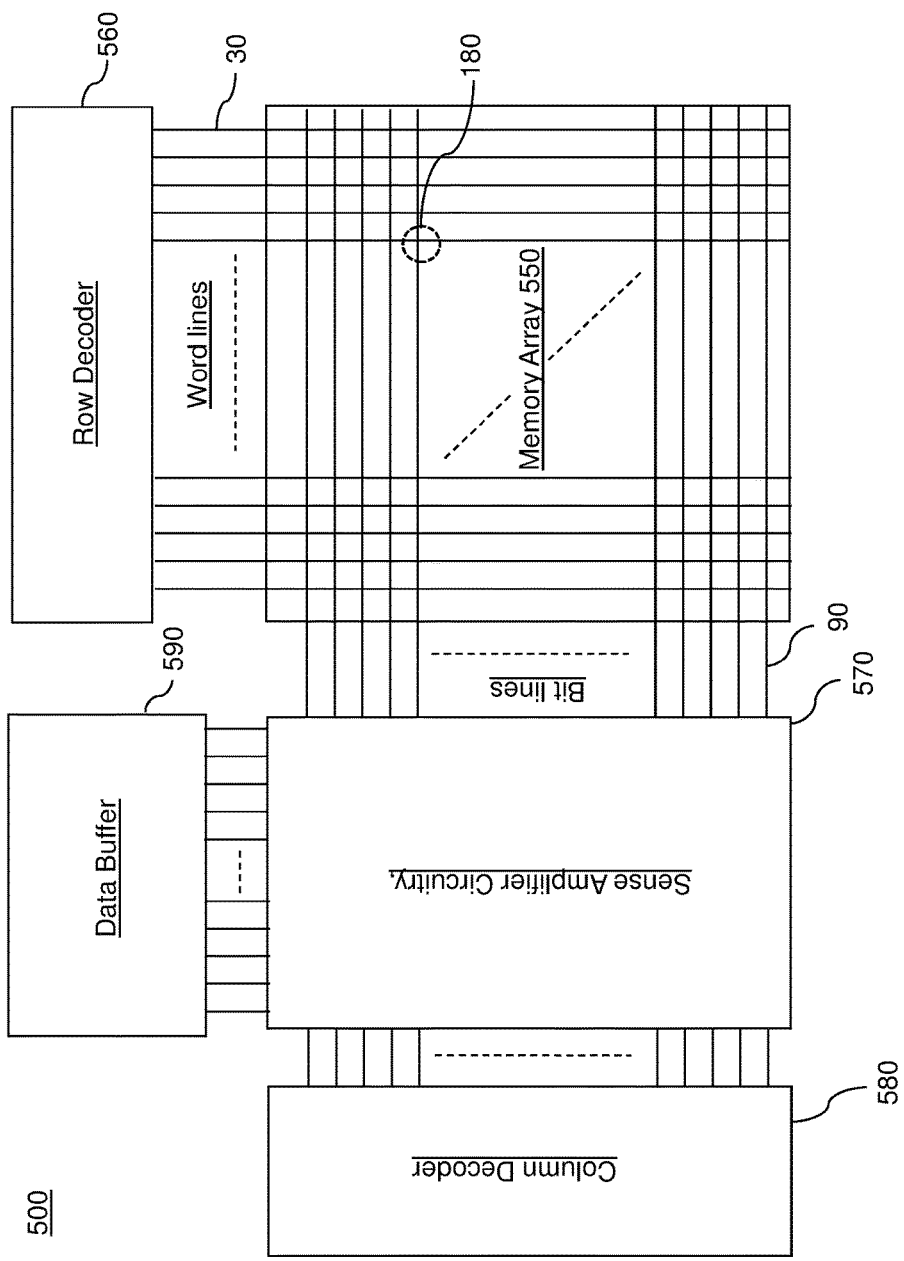
FIG. 1 is a schematic diagram of a memory device including resistive memory cells of the present disclosure in an array configuration.

Resistive random access memory devices can be formed employing a replacement scheme, in which sacrificial material layers are replaced with electrically conductive layers. However, the present inventors realized that resistive memory material portions are prone to collateral damage during an etch process that removes the sacrificial material layers. For example, titanium oxide material is collaterally etched by hot phosphoric acid that etches silicon nitride, and by hydrofluoric acid that etches silicon oxide. Thus, embodiments of the present disclosure provide a method for replacement of sacrificial layers with electrically conductive layers without damaging the resistive memory material portions.

As discussed above, the present disclosure is directed to a resistive random access memory device and methods of manufacturing the same, the various aspects of which are described below. The embodiments of the disclosure can be employed to form various semiconductor devices such as three-dimensional monolithic memory array devices comprising ReRAM devices. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "resistive memory material" or a "reversibly resistance-switching material" is a material of which the resistivity can be altered by application of a voltage across the material. As used herein, a "resistive memory material layer" refers to a layer including a resistive memory material. As used herein, a "resistive memory element" refers to an element that includes a portion of a resistive memory material in a configuration that enables programming of the resistive memory material into at least two states having different values of electrical resistance.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays.

Referring to FIG. 1, a schematic diagram is shown for a non-volatile memory device including non-volatile memory cells of the present disclosure in an array configuration. The non-volatile memory device can be configured as a resistive random access memory device. As used herein, a "random access memory device" refers to a memory device including memory cells that allow random access, i.e., access to any selected memory cell upon a command for reading the contents of the selected memory cell. As used herein, a "resistive random access memory device" refers to a random access memory device in which the memory cells include a resistive memory element.

The resistive random access memory device 500 of the present disclosure includes a memory array region 550 containing an array of the respective memory cells 180 located at the intersection of the respective word lines (which may be embodied as first electrically conductive lines 30 as illustrated or as second electrically conductive lines 90 in an alternate configuration) and bit lines (which may be embodied as second electrically conductive lines 90 as illustrated or as first electrically conductive lines 30 in an alternate configuration). The device 500 may also contain a row decoder 560 connected to the word lines, a sense circuitry 570 (e.g., a sense amplifier and other bit line control circuitry) connected to the bit lines, a column decoder 580 connected to the bit lines and a data buffer 590 connected to the sense circuitry. Multiple instances of the resistive memory cells 180 are provided in an array configuration that forms the random access memory device 500. It should be noted that the location and interconnection of elements are schematic and the elements may be arranged in a different configuration.

Each resistive memory cell 180 includes a resistive memory material having at least two different resistive states. The resistive memory material portion is provided between a first electrode and a second electrode within each resistive memory cell 180. Configurations of the resistive memory cells 180 are described in detail in subsequent sections. The resistive memory material portion may include a non-filamentary barrier modulated cell (BMC), which includes a barrier and an electrically conductive metal oxide whose resistivity is switched by at least one of oxygen ion and/or oxygen vacancy diffusion in response to an application of an electric field thereto.

FIGS. 2A to 6C illustrate an optional embodiment process of forming an in-process device containing select transistors and an alternating stack of a sacrificial material layers and insulating layers for a ReRAM device which has three-dimensional vertical bit line ("VBL") configuration. As used herein, a "prototype" structure or an "in-process" structure refers to a transient structure that is subsequently modified in the shape or composition of at least one component therein.

Figure 2A:
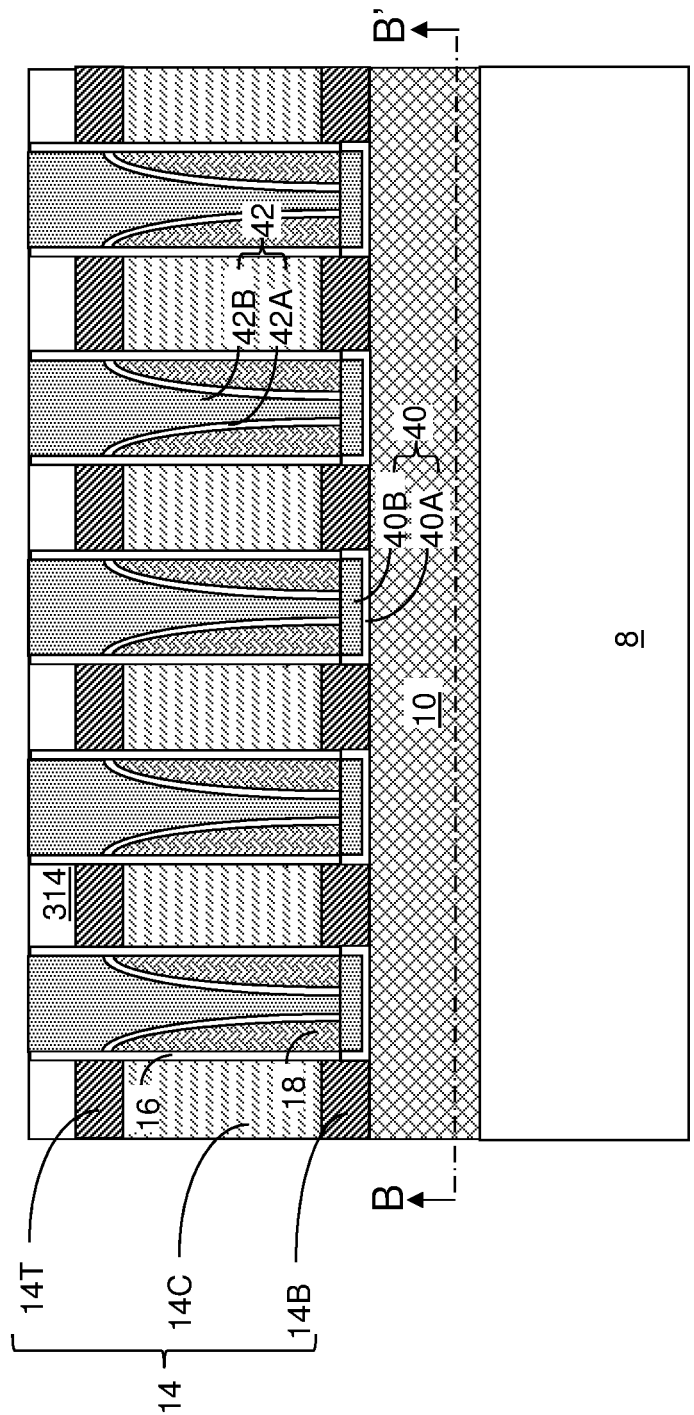
FIG. 2A is a vertical cross-sectional view of an exemplary structure after formation of bit line access transistors and dielectric fill layers according to an embodiment of the present disclosure.
Figure 2B:
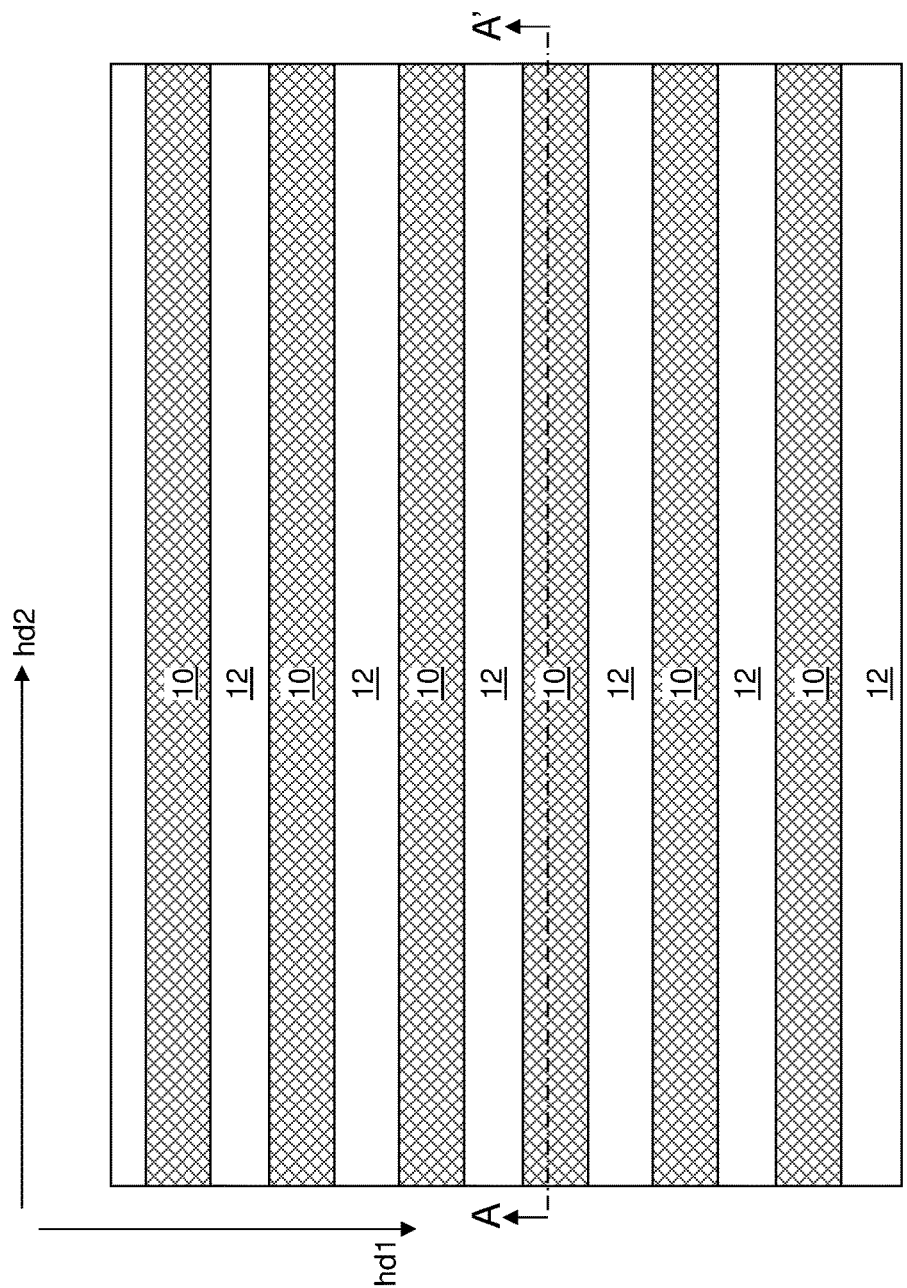
FIG. 2B is a horizontal cross-sectional view of the exemplary structure of FIG. 2A along the horizontal plane B-B' of FIG. 2A.
Figure 2C:
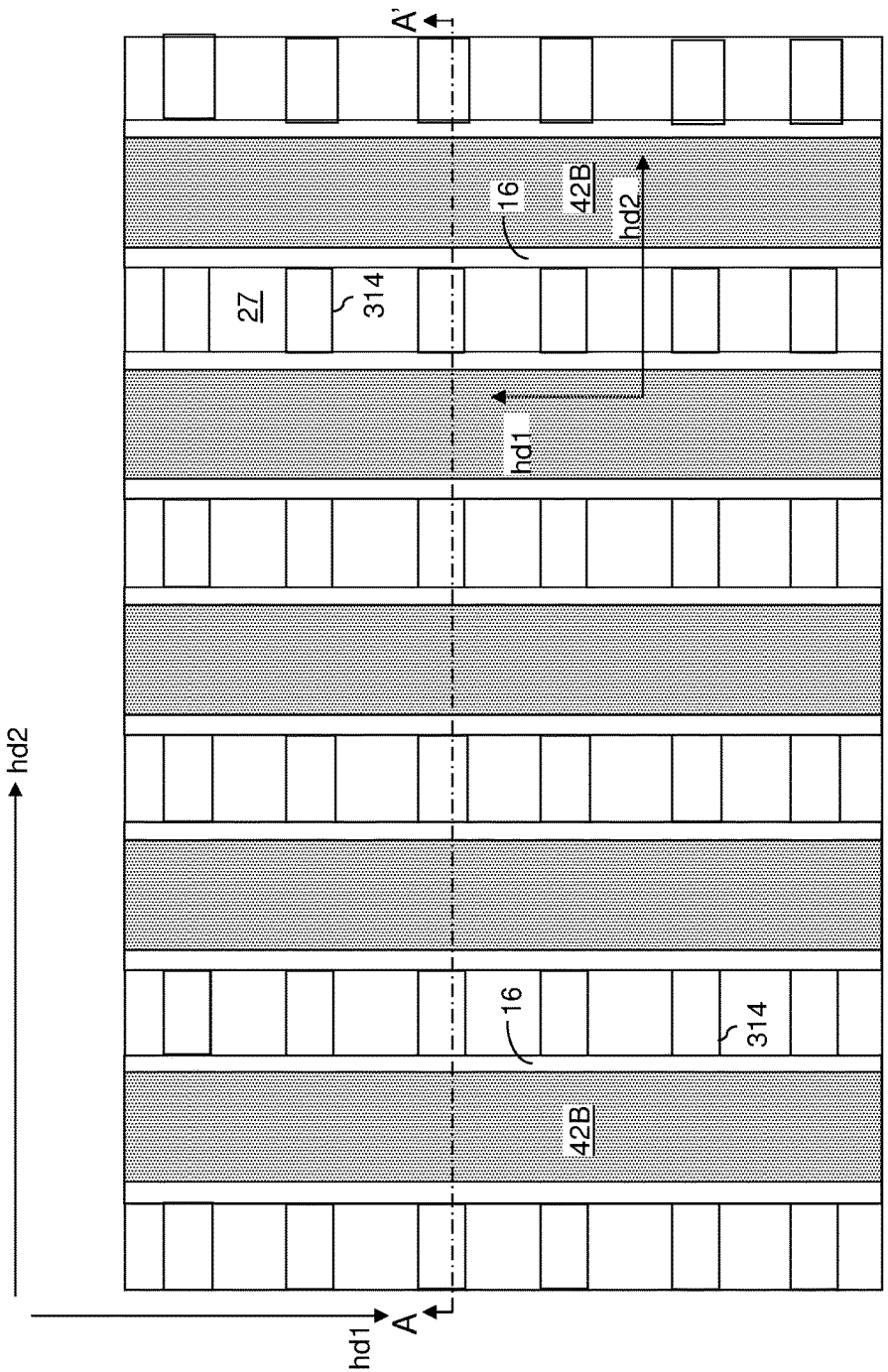
FIG. 2C is a see-through top-down view of the exemplary structure of FIG. 2A. The vertical plane A-A' is the plane of the cross-section for FIG. 2A.

Referring to FIGS. 2A-2C, an exemplary starting structure according to an embodiment of the present disclosure is illustrated, which can be an in-process ReRAM device. The exemplary structure includes a substrate 8, which includes an insulating layer at an upper portion thereof. In one embodiment, the substrate 8 can be a stack of at least two material layers such as a stack of an underlying substrate material layer and an overlying substrate insulating layer. The substrate material layer can be a semiconductor material layer, a conductive material layer, or an insulating material layer that can provide structural support to the overlying structures, and may have a thickness greater than 50 microns, and typically in a range between 300 microns and 3 mm In one embodiment, the substrate material layer can be a semiconductor wafer, such as a silicon wafer as known in the art. The substrate insulating layer can include an insulating material, and can have a thickness in a range from 100 nm to 3 microns, although lesser and greater thicknesses can also be employed.

In case the substrate material layer includes a semiconductor material, peripheral semiconductor devices for operation of a memory array device can be formed in, or on, the substrate material layer. For example, sense amplifiers, input-output (I/O) circuitry, control circuitry, and any other necessary peripheral circuitry can be formed on, or in, the substrate material layer. Additional devices that can be formed in, or on, the substrate material layer include, but are not limited to, global bit line select transistors for selecting global bit lines to be activated, local bit line select transistors for selecting local bit lines to be activated, and word line select transistor for selecting word lines to be activated.

Global bit lines 10 are formed over the substrate 8. The global bit lines 10 are parallel electrically conductive lines that are laterally spaced apart in a first horizontal direction hd1, and extending in a second horizontal direction hd2. The global bit lines 10 can be formed, for example, by depositing at least one conductive material layer, and patterning the at least one conductive material layer employing a combination of lithographic methods and an anisotropic etch. The at least one conductive material layer can include, for example, at least one elemental metal (such as W, Co, Cu, and Al), a conductive doped semiconductor material, an intermetallic alloy including at least two elemental metals, a conductive metallic nitride, or a conductive metallic carbide. For example, the at least one conductive material layer can include a metallic barrier layer (such as a layer of TiN, TaN, or WN) and a metal layer (such as a layer of W, Ti, Ta, Cu, Al, or an alloy thereof). The space between the global bit lines 10 can be filled with a dielectric material (such as silicon oxide). The dielectric material can be subsequently planarized to remove excess portions from above a horizontal plane including the top surfaces of the global bit lines 10 to form separator dielectric material portions 12. Each global bit lines 10 and each separator dielectric material portions 12 can extend along the second horizontal direction hd2. A one-dimensional array of the global bit lines 10 and the separator dielectric material portions 12 can extend along the first horizontal direction hd1 with a periodicity that is equal to the sum of the width of a global bit line 10 and the width of a separator dielectric material portion 12. Alternatively, the one-dimensional array of the global bit lines 10 and the separator dielectric material portions 12 may be formed by depositing a dielectric material layer, forming trenches extending along the second horizontal direction hd2 and laterally spaced from one another along the first horizontal direction hd1, and filling the trenches with at least one conductive material to form the global bit lines 10 therein.

A two-dimensional array of select devices can be formed on the global bit lines 10 such that multiple select devices are formed on each global bit line 10. In one embodiment, the select devices can be transistor such as vertical thin film transistors employing a polycrystalline semiconductor channel Examples of suitable transistors for the select devices are described, for example, in U.S. patent application Ser. No. 14/206,196, filed Mar. 12, 2014, which is incorporated by reference herein in its entirety. In case the select devices are field effect transistors, the select transistors are herein referred to access transistors.

Bit line access transistors are subsequently formed on global bit line 10. Each access transistor can be a vertical field effect transistor, and can include a bottom active region 14B (which can be a source region or a drain region), a semiconductor channel 14C, and a top active region 14T (which can be a drain region if the underlying bottom active region 14B is a source region, and a source region if the underlying bottom active region 14B is a drain region). As used herein, an "active region" refers to a source region or a drain region.

The bit line access transistors can be formed by forming a semiconductor layer stack 14 including a first doped semiconductor layer for forming the bottom active regions 14B, a semiconductor channel material layer for forming the semiconductor channels 14C, and a second doped semiconductor layer for forming the top active regions 14T, which has a same type of doping as the first semiconductor layer. The semiconductor layer stack 14 can be patterned employing a combination of lithographic methods and an anisotropic etch such that each patterned portion of the semiconductor layer stack 14 is a rail structure that laterally extend along the first horizontal direction, and is laterally spaced apart among one another along the second horizontal direction by line trenches that extend along the first horizontal direction.

A spacer dielectric layer 40 can be formed at the bottom the line trenches by depositing a self-planarizing dielectric material (such as spin-on glass) or by filling the trenches with a dielectric material (such as organosilicate glass), planarizing the deposited dielectric material, and recessing the dielectric material selective to the rail structures including the materials of the semiconductor layer stack 14. Each spacer dielectric layer 40 can be formed over of the global bit lines 10 and the separator dielectric material portions 12 such that the top surface of the spacer dielectric layer 40 is located at a target height for placing a bottom edge of gate electrodes 18 to be subsequently formed. For example, the top surface of the spacer dielectric layer 40 can be at a level about the interface between the remaining portions of the first conductivity type semiconductor layer and the channel material layer. In one embodiment, each spacer dielectric liner 40 can include a first dielectric liner 40A such as a silicon nitride liner and a second dielectric liner 40B such as a silicon oxide liner.

The gate dielectrics 16 and the gate electrodes 18 of the access transistors can be subsequently formed, for example, by depositing a conformal gate dielectric layer (e.g., silicon oxide) and a conformal conductive material layer (e.g., heavily or degenerately doped polysilicon) in the line trenches that separate the one-dimensional array of rail structures, and by anisotropically etching the conformal conductive material layer. The remaining vertical portions of the conformal conductive material layer constitute the gate electrodes 18, which extend along the first horizontal direction hd1. Each remaining portion of the conformal gate dielectric layer constitutes a gate dielectric 16. Each gate electrode 18 is laterally spaced from an adjacent rail structure by a vertical portion of a gate dielectric 16.

Remaining volumes of the line trenches are filled with at least one dielectric material. Excess portions of the at least one dielectric material can be removed from above the horizontal plane including the top surfaces of the rail structures (including the materials of the semiconductor layer stack 14) by a planarization process, which can employ, for example, chemical mechanical planarization. Each remaining portion of the deposited dielectric material in the trenches constitutes a dielectric rail structure 42, which is also referred to as an access transistor level dielectric rail. In one embodiment, each dielectric rail structure 42 can include a dielectric rail liner 42A and a dielectric rail fill material portion 42B. Each dielectric rail structure 42 extends along the first horizontal direction hd1.

The rail structures that include the materials of the semiconductor layer stack 14 can be patterned to form a two-dimensional array of pillar cavities that extend to the top surfaces of the separator dielectric material portions 12. For example, a photoresist layer can be applied over the rail structures that include the materials of the semiconductor layer stack 14 and the dielectric rail structures 42, and can be lithographically patterned to form openings in areas overlying the separator dielectric material portions 12. A one-dimensional array of line patterns can be employed, in which each line pattern laterally extends along the second horizontal direction. An anisotropic etch that removes semiconductor materials of the semiconductor layer stack 14 selective to the material of the access transistor dielectric rails 42 can be performed employing the patterned photoresist layer as an etch mask to form the two-dimensional array of pillar cavities. After removal of the photoresist layer, the pillar cavities can be filled with a dielectric material to form dielectric pillar spacers 27, as shown in FIG. 2C.

Each patterned portion of the semiconductor layer stack 14 can be a semiconductor pillar structure (14B, 14C, 14T) including a vertical stack of a bottom active region 14B, a semiconductor channel 14C, and a top active region 14T. The dielectric pillar spacers 27 are located between each neighboring pair of semiconductor pillar structures (14B, 14C, 14T) that are laterally spaced apart along the first horizontal direction hd1. Each alternating sequence of dielectric pillar spacers 27 and semiconductor pillar structures (14B, 14C, 14T) that extend along the first horizontal direction hd1 forms a composite rail structure (14B, 14C, 14T, 27). The composite rail structures (14B, 14C, 14T, 27) are laterally spaced from one another along the second horizontal direction hd2.

Optionally, top surfaces of the top active regions 14T may be optionally vertically recessed, and a sacrificial material can be deposited to temporarily protect the semiconductor pillar structures (14B, 14C, 14T) during subsequent processing steps. The sacrificial material can be planarized so that the top surfaces of the remaining sacrificial material portions are coplanar with the top surfaces of the dielectric rail structures 42. The sacrificial material portions are herein referred to as sacrificial cap structures 314. If the sacrificial cap structures 314 are present, each composite rail structure (14B, 14C, 14T, 27, 314) includes a row of sacrificial cap structures 314.

Each composite rail structure (14B, 14C, 14T, 27, 314) includes remaining portions of the semiconductor layer stack 14 and the dielectric pillar spacers 27 between a neighboring pair of dielectric rail structures 42. Each dielectric rail structure 42 can have a substantially vertical bottom portion, or can have a tapered bottom portion in which the width of the dielectric rail structure 42 monotonically or strictly increases as a function of a vertical distance from the substrate 8. In one embodiment, each dielectric rail structure 42 can include at least one dielectric material such as silicon nitride and/or silicon oxide. The dielectric rail structures 42 and the composite rail structures (14T, 14C, 14B, 27, 314) alternate along the second horizontal direction hd2.

Figure 3A:
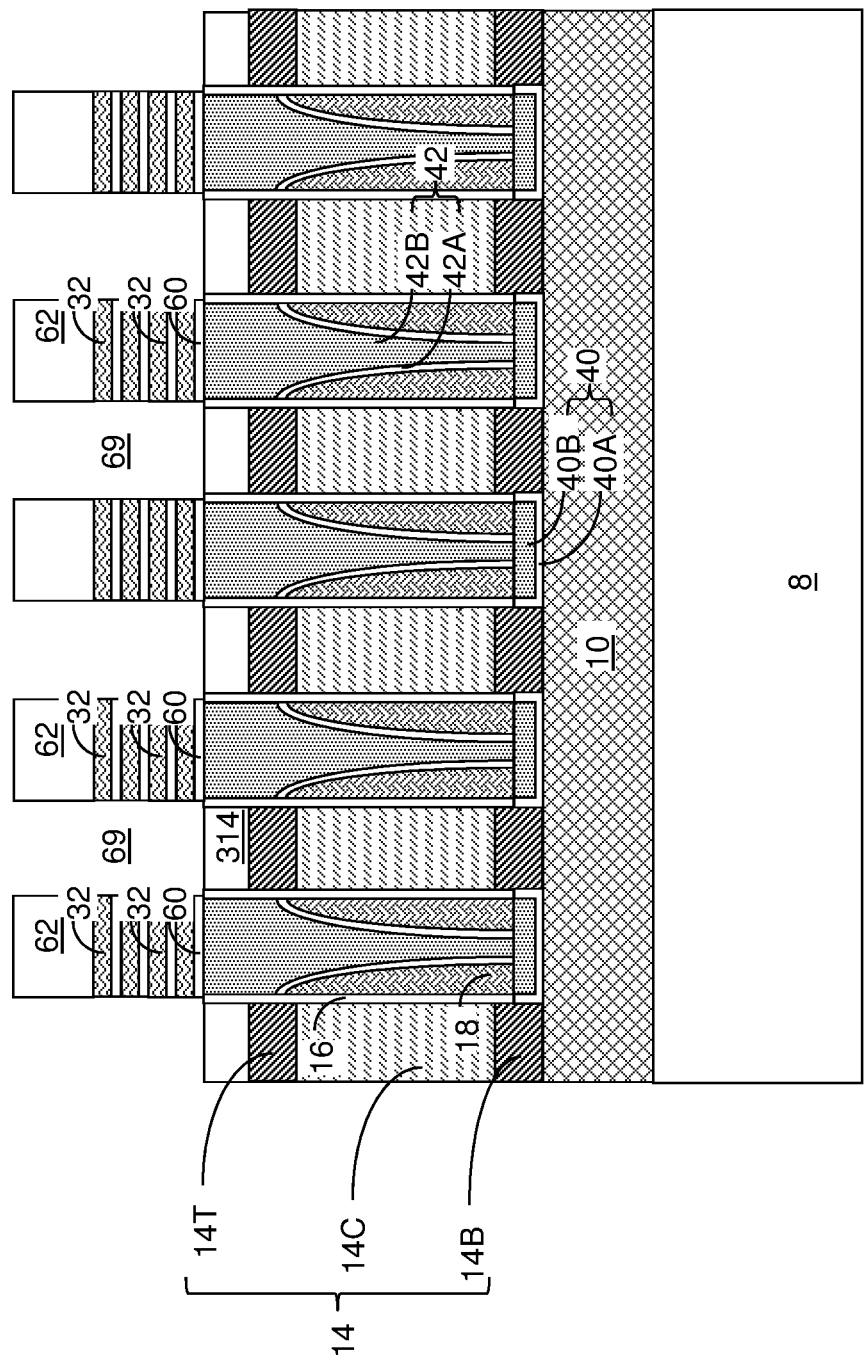
FIG. 3A is a vertical cross-sectional view of the exemplary structure after formation of alternating stacks of insulating layers and sacrificial material layers according to an embodiment of the present disclosure.
Figure 3B:
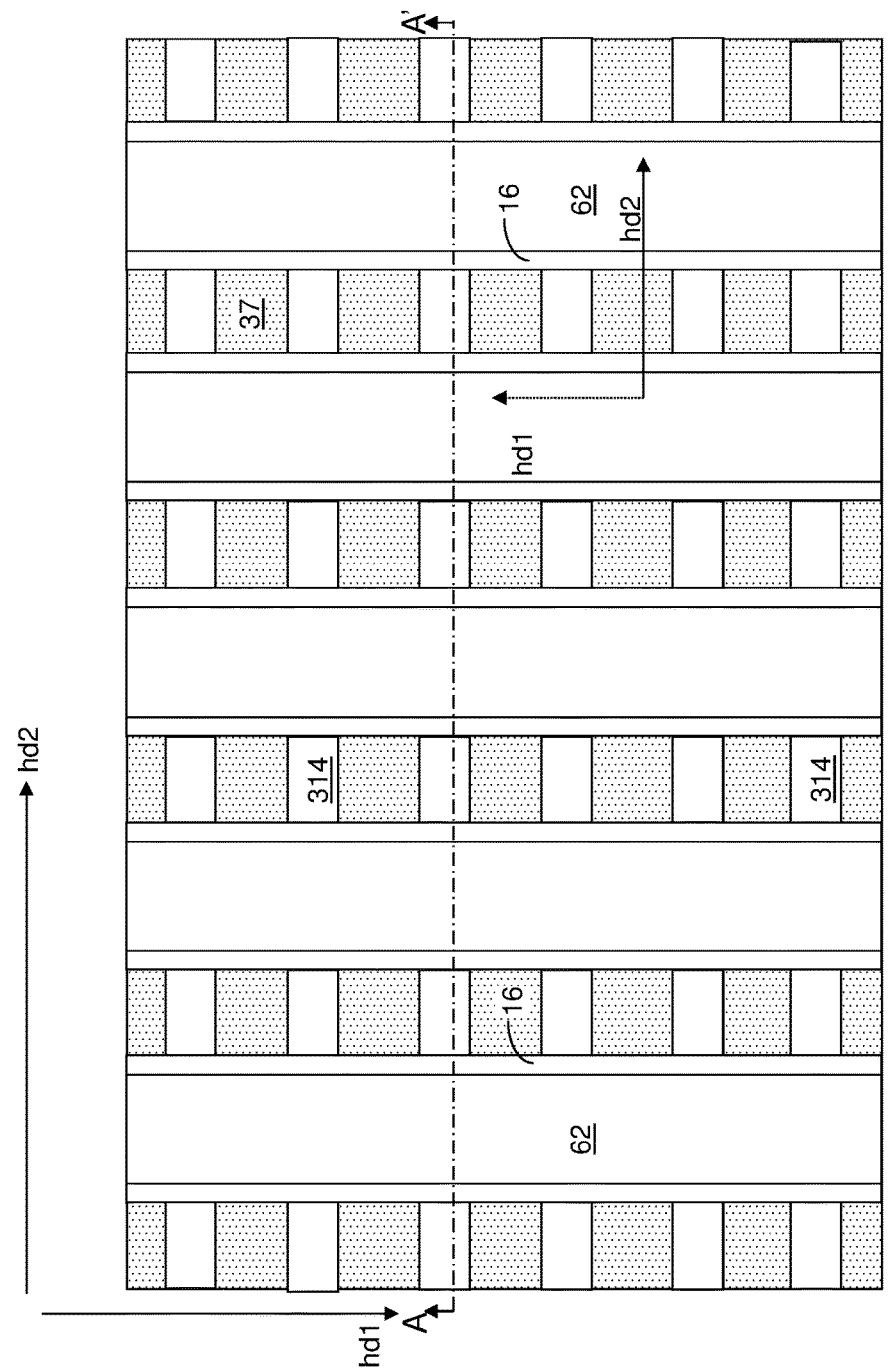
FIG. 3B is a top-down view of the exemplary structure of FIG. 3A. The vertical plane A-A' is the plane of the cross-section for FIG. 3A.

Referring to FIGS. 3A and 3B, an alternating stack of continuous sacrificial material layers and continuous insulating layers can be formed over the dielectric rail structures 42 and the composite rail structures (14T, 14C, 14B, 27, 314) as stacks of blanket (unpatterned) layers. A continuous insulating cap layer can be formed over the alternating stack of the spacer material layers and the insulating layers. The continuous sacrificial material layers include a sacrificial material that is subsequently replaced with at least one conductive material to provide electrically conductive layers, as will be described in more detail below.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of the sacrificial material layers and the insulating layers may begin with an instance of the sacrificial material layers or with an instance of the insulating layers, and may terminate with an instance of the sacrificial material layers or with an instance of the insulating layers. In one embodiment, an instance of the first elements and an instance of the second elements may form a unit that is repeated with periodicity within the alternating plurality.

Subsequently, the continuous insulating cap layer and the alternating stack of the continuous sacrificial material layers and the continuous insulating layers are patterned to form line stack rail structures. For example, a photoresist layer can be applied over the continuous insulating cap layer, and can be lithographically patterned to mask the areas of the dielectric rail structures 42 while not covering the areas of the composite rail structures (14T, 14C, 14B, 27, 314). In one embodiment, sidewalls of the patterned photoresist layer can be laterally offset from the boundaries between the dielectric rail structures 42 and the composite rail structures (14T, 14C, 14B, 27, 314) to ensure that the entire areas of the composite rail structures (14T, 14C, 14B, 27, 314) are not covered by the patterned photoresist layer.

An anisotropic etch can be performed through the continuous insulating cap layer and the alternating stack of the continuous sacrificial material layers and the continuous insulating layers. Line trenches 69 laterally extending along the first horizontal direction hd1 and laterally spaced apart along the second horizontal direction hd2 can be formed. The line trenches 69 are herein referred to as memory level line trenches. Further, the sacrificial cap structures 314 can be removed from underneath the line trenches 69 to physically expose the top surfaces of the top active regions 14T of the vertical field effect transistors.

The line trenches divide the continuous insulating cap layer and the alternating stack of the continuous sacrificial material layers and the continuous insulating layers into multiple rail structures that extend along the first horizontal direction hd1 and laterally spaced apart along the second horizontal direction hd2. The rail structures are herein referred to as line stack rail structures. Each line stack rail structure overlies a dielectric rail structure 42, extends along the first horizontal direction hd1, and is laterally spaced apart from one another along the second horizontal direction hd2.

Each patterned portion of the continuous insulating cap layer is herein referred to as an insulating cap layer 62, which may be an insulating cap strip. Each patterned portion of the continuous sacrificial material layers is herein referred to as a sacrificial material layer 32 (which may function as word lines), which may be a sacrificial material strip. Each patterned portion of the continuous insulating layer is herein referred to as an insulating layer 60, which may be an insulating strip. As used herein, a "strip" refers to an elongated line, which may have a uniform width throughout or may have laterally protruding or laterally recessed regions. In one embodiment, each of the insulating cap layers 62, the sacrificial material layers 32, and the insulating layers 60 can have a respective uniform width that is invariant along the first horizontal direction hd1. Thus, each line stack rail structure (32, 60, 62) includes an alternating stack of sacrificial material layers 32 and insulating layers 60, and an insulating cap portion 62. In one embodiment, each line stack rail structure (32, 60, 62) can have a lesser width along the second horizontal direction hd2 than the underlying dielectric rail structure 42, and can be entirely within the area of the underlying dielectric rail structure 42.

In one embodiment, the sacrificial material layers 32 comprise silicon nitride. The insulating layers 60 and the insulating cap portion 62 may comprise any suitable insulating material, such as silicon oxide. The thickness of the sacrificial material layers 32 can be in a range from 6 nm to 60 nm, although lesser and greater thicknesses can also be employed. The thickness of the insulating lines 60 can be in a range from 6 nm to 60 nm, although lesser and greater thicknesses can also be employed. The thickness of the insulating cap portions 62 can be in a range from 6 nm to 300 nm, although lesser and greater thicknesses can also be employed.

A pair of a sacrificial material layer 32 and an insulating layer 60 can constitute a unit of repetition the alternating stack (32, 60) of the sacrificial material layers 32 and the insulating layers 60. The total number of repetitions can be in a range from 8 to 1,024, although lesser and greater number of repetitions can also be employed. Thus, a plurality of alternating stacks (32, 60) of insulating layers 60 (which may be insulating strips) and sacrificial material layers 32 (which may be sacrificial material strips) is formed over a substrate 8. Each of the insulating layers 60 and the sacrificial material layers 32 extends along the first horizontal direction (i.e., the word line direction) hd1. The alternating stacks (32, 60) are laterally spaced from one another along the second horizontal direction hd2 (i.e., the global bit line direction).

Figure 4A:
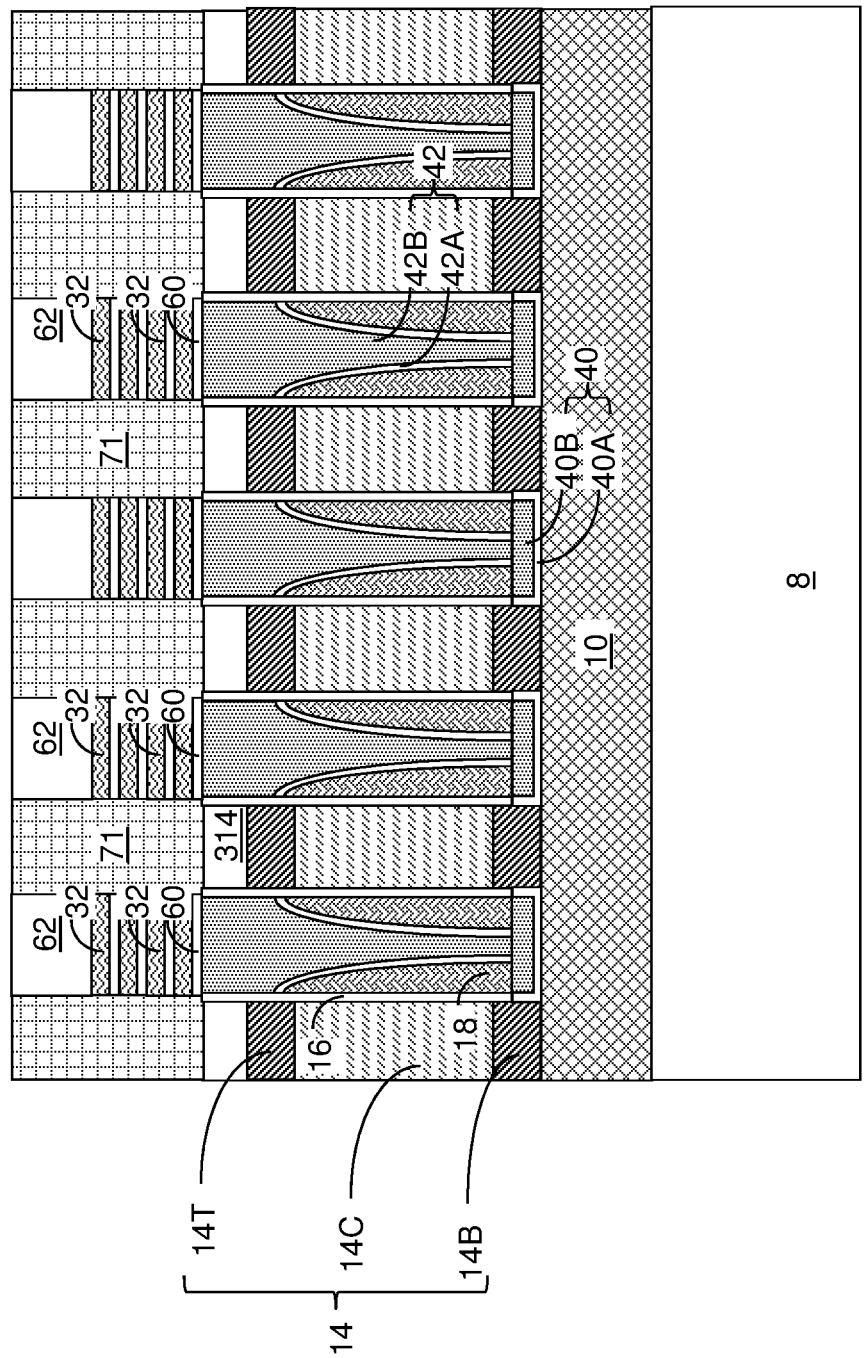
FIG. 4A is a vertical cross-sectional view of the exemplary structure after formation of sacrificial rail structures according to an embodiment of the present disclosure.
Figure 4B:
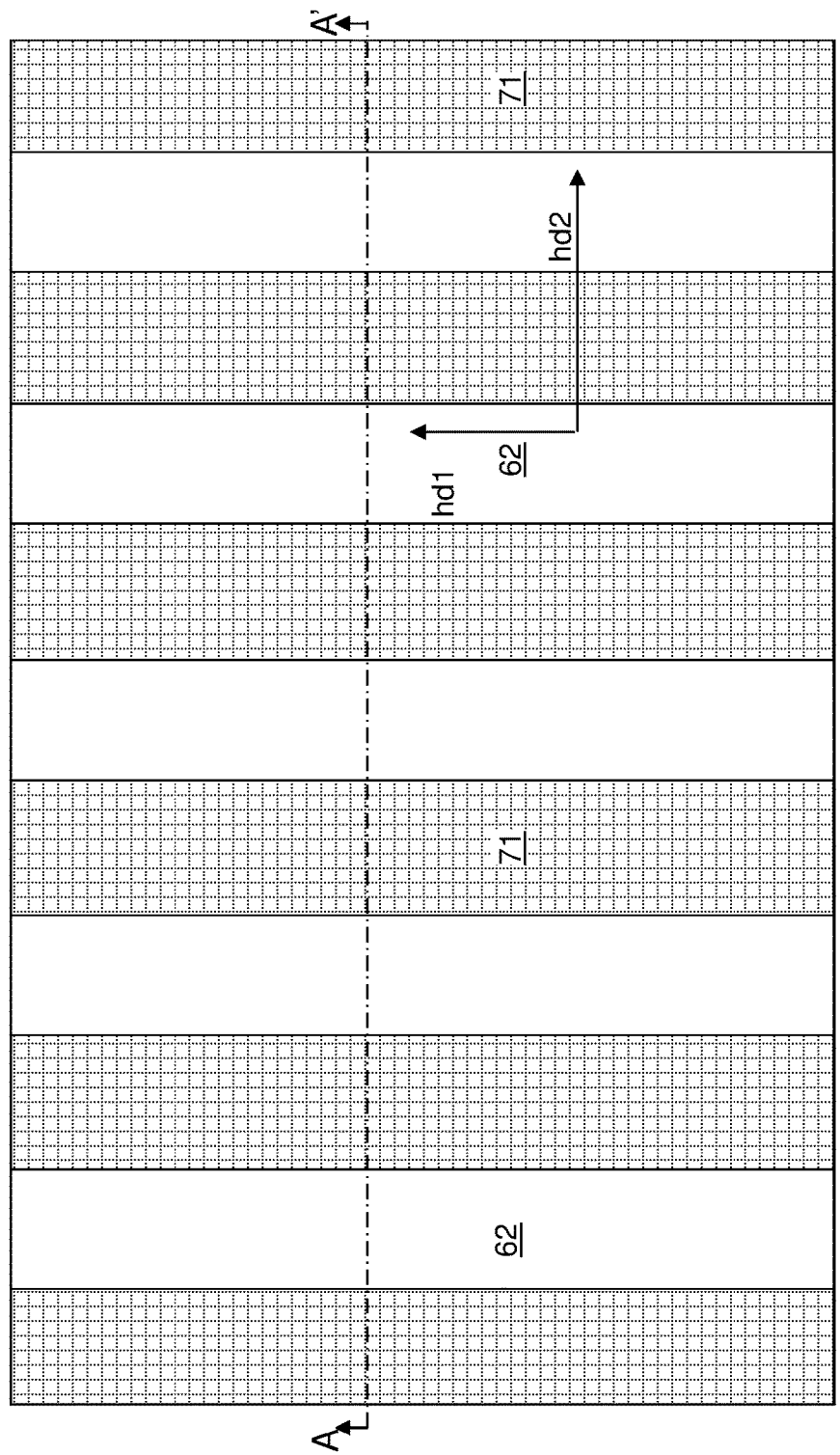
FIG. 4B is a top-down view of the exemplary structure of FIG. 4A. The vertical plane A-A' is the plane of the cross-section for FIG. 4A.

Referring to FIGS. 4A and 4B, a sacrificial fill material is deposited in the line trenches 69. The sacrificial fill material is a material that can be removed selective to the materials of the alternating stacks (32, 60), the insulating cap layers 62, the dielectric pillar spacers 27, and the sacrificial cap structures 314. For example, if the insulating layers 60, the insulating cap layers 62, and the dielectric pillar spacers 27 include silicon oxide, if the sacrificial material layers 32 include silicon nitride, and if the sacrificial cap structures 314 include silicon nitride, the sacrificial fill material can include a semiconductor material such as amorphous silicon, amorphous carbon, diamond-like carbon, a silicon-based polymer. Excess portions of the sacrificial fill material can be removed from above the horizontal plane including the top surfaces of the insulating cap layers 62 by a planarization process, which can employ a recess etch and/or chemical mechanical planarization. Each remaining portion of the sacrificial fill material in the line trenches 69 constitutes sacrificial rail structures 71.

Figure 5A:
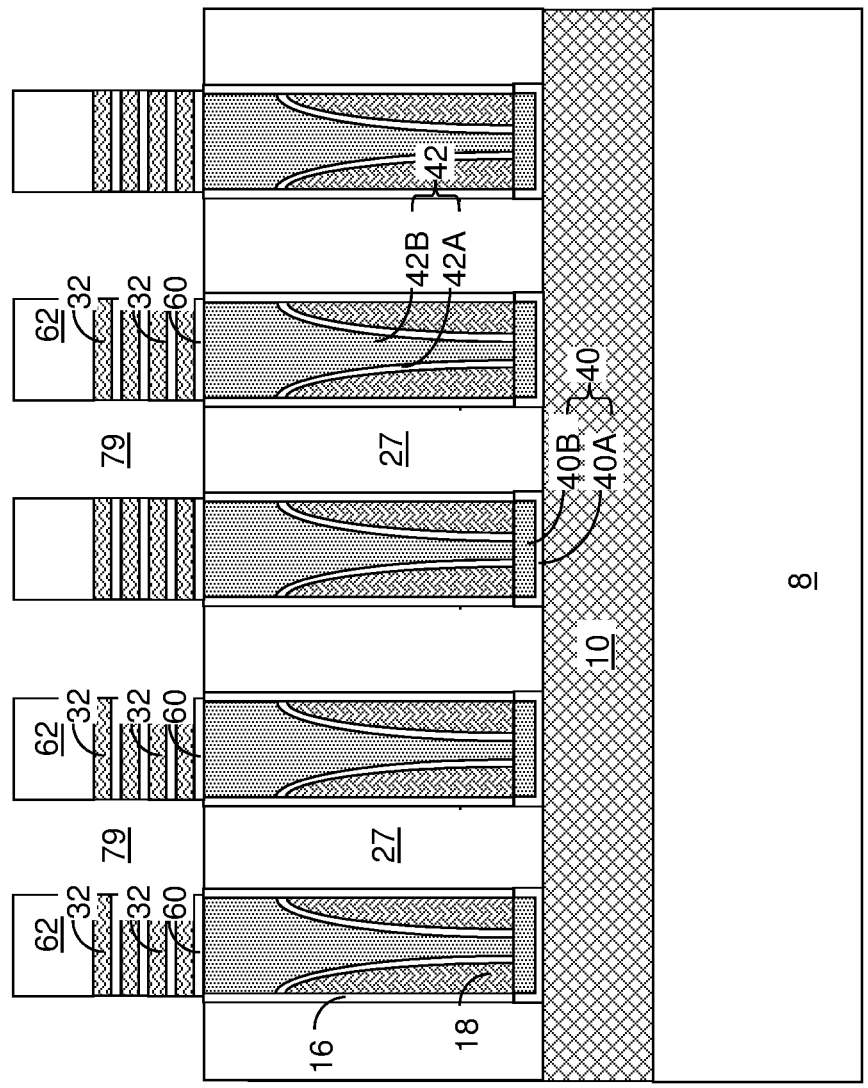
FIG. 5A is a vertical cross-sectional view of the exemplary structure after formation of pillar cavities according to an embodiment of the present disclosure.
Figure 5B:
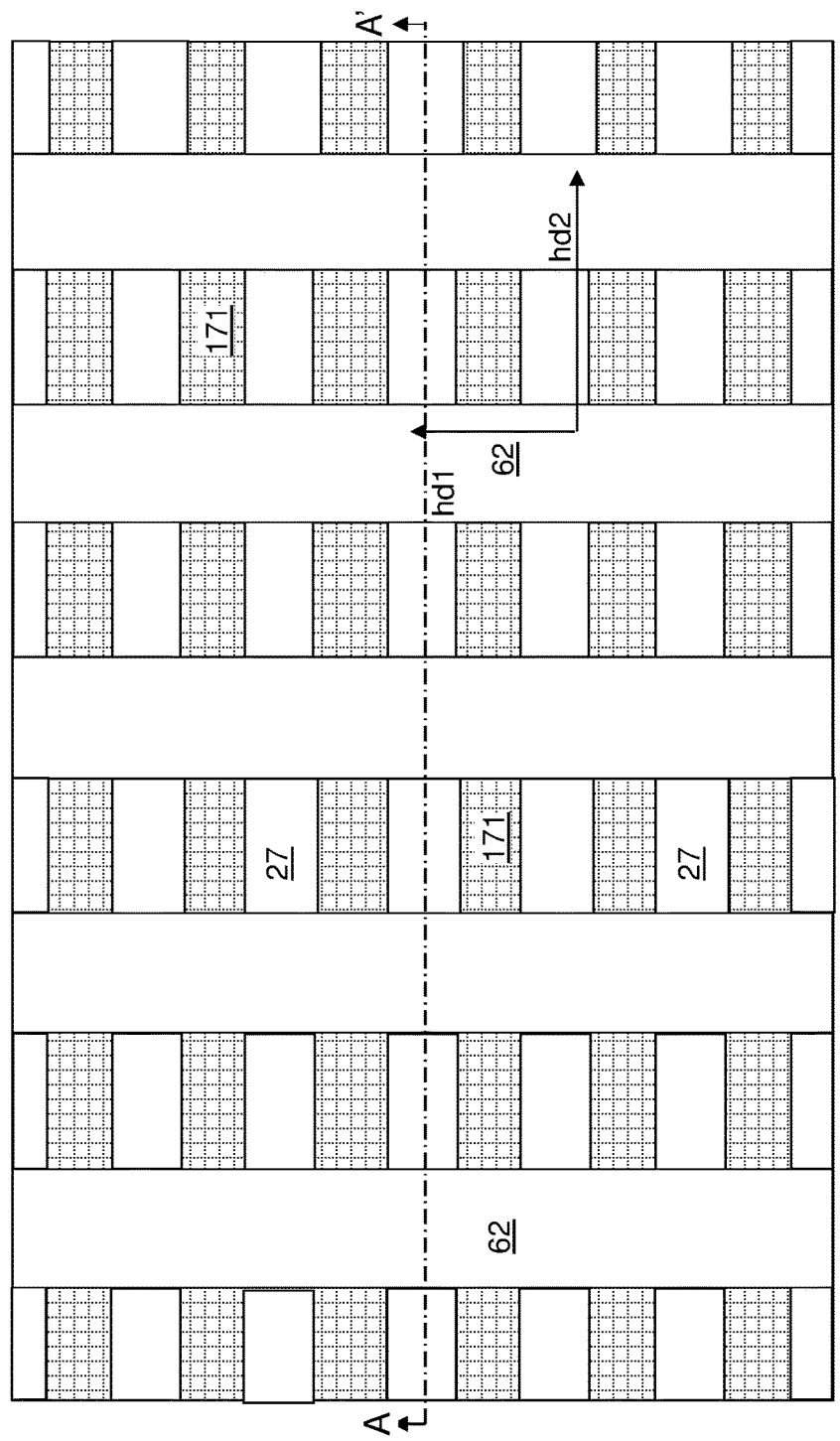
FIG. 5B is a top-down view of the exemplary structure of FIG. 5A. The vertical plane A-A' is the plane of the cross-section for FIG. 5A.

Referring to FIGS. 5A and 5B, a photoresist layer (not shown) can be applied over the insulating cap layers 62 and the sacrificial rail structures 71, and can be lithographically patterned to form a line and space pattern. Line trenches are formed between patterned portions of the photoresist layer such that the line trenches overlie the areas of the dielectric pillar spacers 27, while the patterned portions of the photoresist layer cover the areas of the semiconductor pillar structures (14B, 14C, 14T). An anisotropic etch process that etches the material of the sacrificial rail structures 71 selective to the material of the insulating cap layer 62 can be performed to remove unmasked portions of the sacrificial rail structures 71.

Pillar cavities 79 are formed in the volumes from which the material of the sacrificial rail structures 71 is removed by the anisotropic etch. The pillar cavities 79 can have a respective rectangular horizontal cross-sectional shape. The remaining portions of the sacrificial rail structures 71 constitute sacrificial pillar structures 171, which can be arranged as a two-dimensional array.

Figure 6A:
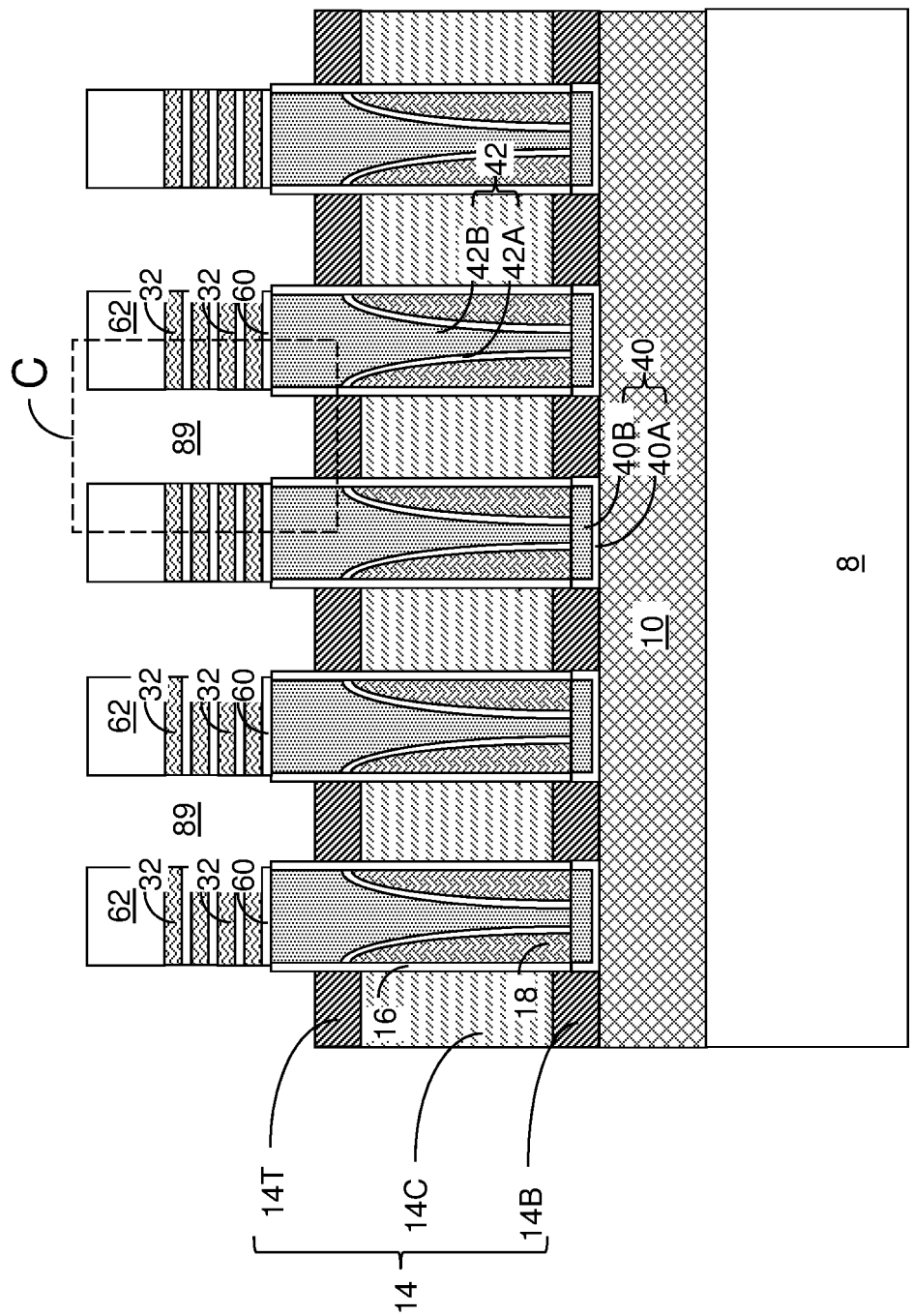
FIG. 6A is a vertical cross-sectional view of the exemplary structure after formation of dielectric pillar structures in the pillar cavities and removal of remaining portions of the sacrificial rail structures to form memory openings according to an embodiment of the present disclosure.
Figure 6B:
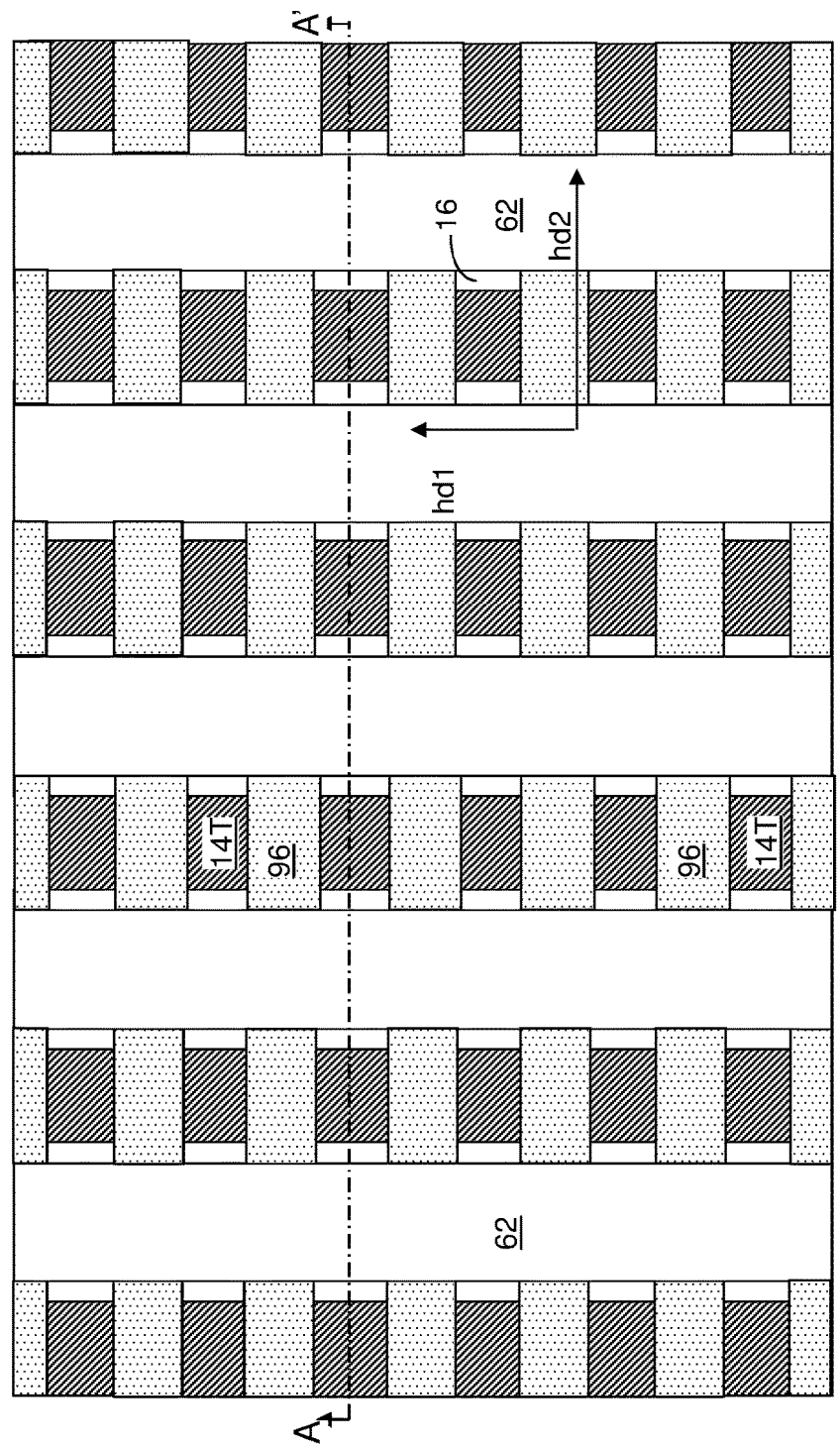
FIG. 6B is a top-down view of the exemplary structure of FIG. 6A. The vertical plane A-A' is the plane of the cross-section for FIG. 6A.
Figure 6C:
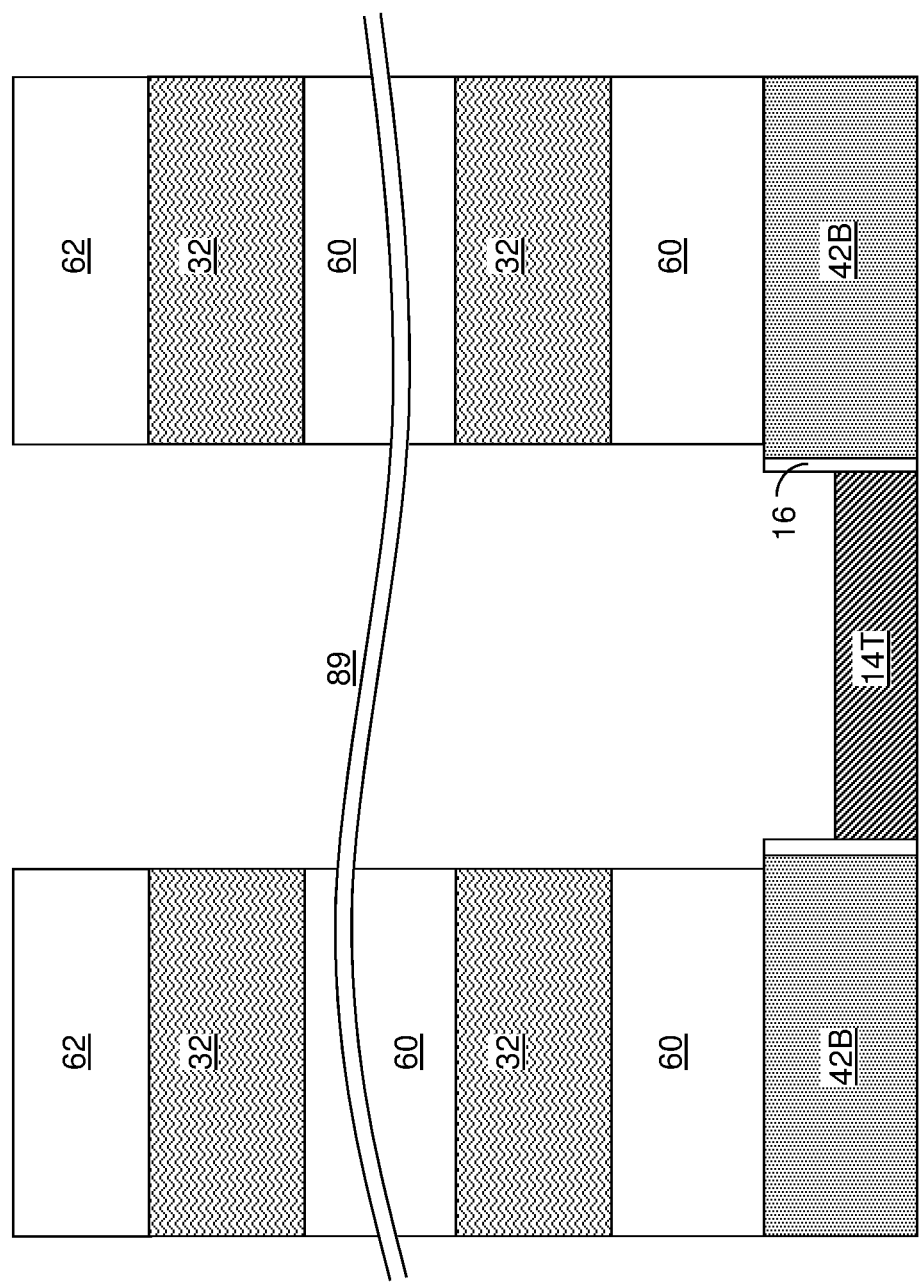
FIG. 6C is a vertical cross-sectional view of a region including a memory opening of the exemplary structure of FIGS. 6A and 6B.

Referring to FIGS. 6A-6C, a dielectric material such as silicon oxide is deposited in the pillar cavities 79. The dielectric material can be deposited by a conformal deposition method or by spin-coating. Excess portions of the dielectric material can be removed from above the horizontal plane including the top surfaces of the insulating cap layers 62 by a planarization process, which can employ a recess etch and/or chemical mechanical planarization. Remaining portions of the dielectric material in the pillar cavities 79 constitute dielectric pillar structures 96, which can be arranged as a two-dimensional periodic array. The two-dimensional array of the sacrificial pillar structures 171 and the two-dimensional array of the dielectric pillar structures 96 can be laterally offset with respect to each other by about one half of the pitch of each two-dimensional array along the first horizontal direction hd1.

Subsequently, the material of the two-dimensional array of the sacrificial pillar structures 171 can be removed selective to the materials of the two-dimensional array of the dielectric pillar structures 96, the insulating cap layers 62, and the alternating stacks (32, 60). For example, if the sacrificial material of the two-dimensional array of the sacrificial pillar structures 171 includes amorphous silicon, a wet etch employing a trimethyl-2 hydroxyethyl ammonium hydroxide (TMY) solution or a KOH solution may be employed to remove the two-dimensional array of the sacrificial pillar structures 171. A two-dimensional array of memory openings 89 can be formed in the volumes from which the sacrificial pillar structures 171 are removed. Each memory opening 89 can have a substantially rectangular horizontal cross-sectional shape. Subsequently, the sacrificial cap structures 314 can be removed from underneath the memory openings 89, for example, by an isotropic etch or an anisotropic etch. The isotropic or anisotropic etch can recess the sacrificial cap structures 314 at least until the top surfaces of the semiconductor pillars 14 are physically exposed. In an illustrative example, if the sacrificial cap structures 314 include silicon nitride, a wet etch employing hot phosphoric acid can be employed. If the sacrificial cap structures 314 include organosilicate glass, a wet etch employing dilute hydrofluoric acid can be employed. The memory openings 89 can be vertically extended by removing the sacrificial cap structures 314.

The above described process illustrated in FIGS. 2A to 6C to form the alternating stack of sacrificial material layers 32 and insulating layers 60 and the select transistors (14, 16, 18) is optional. Any other suitable process may be used instead. For example, the select transistors (16, 18) may be formed by any suitable method followed by forming the alternating stack (60, over the substrate 8. The alternating stack (60, 30) is then photolithographically patterned and etched (reactively ion etched) to form the memory openings 89 through the alternating stack (60, 30) to arrive at the structure shown in FIG. 6C. If desired, region 14T does not have to be recessed compared to the gate dielectric 16, as shown in FIG. 6C.

Figure 7:
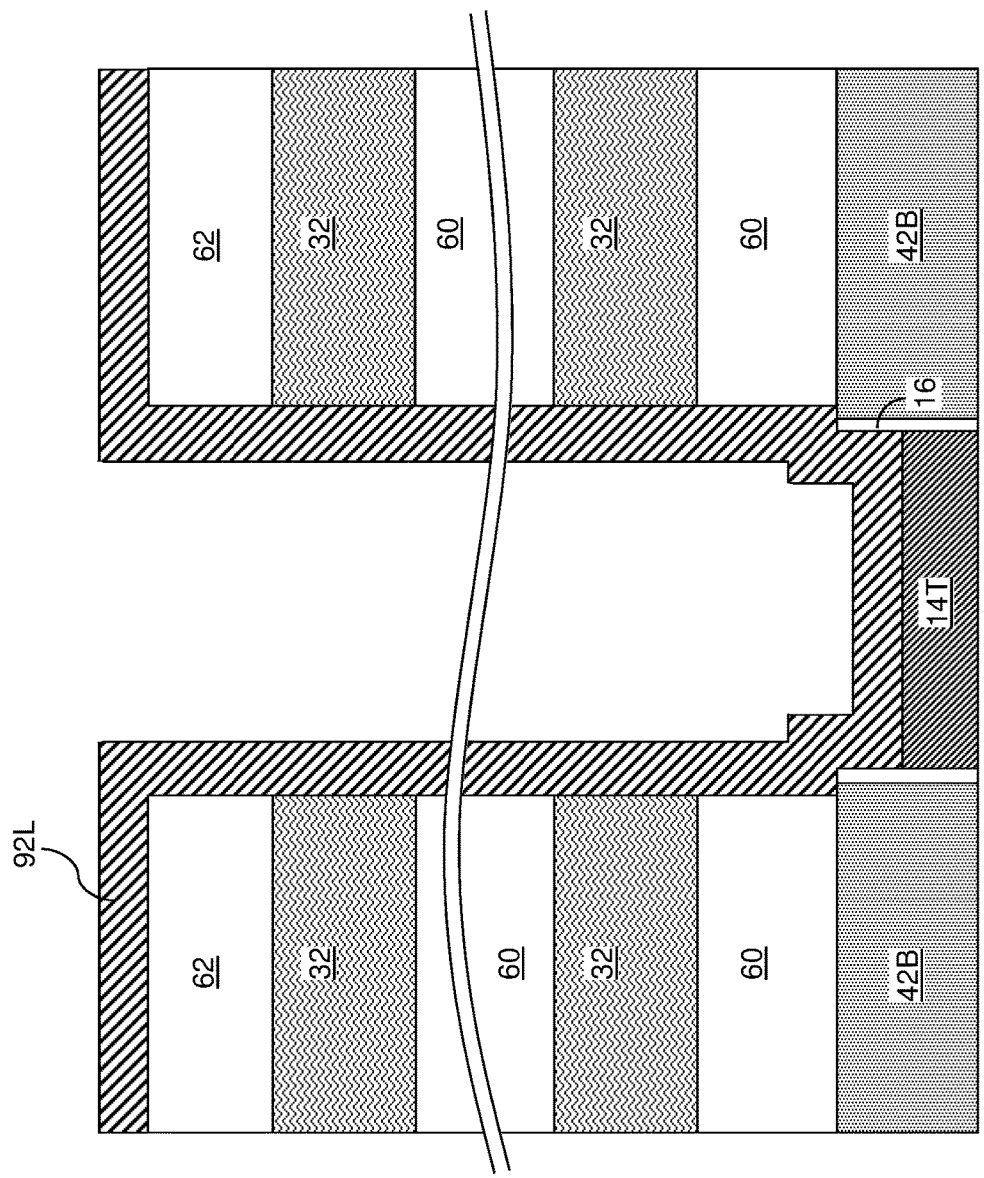
FIG. 7 is a vertical cross-sectional view of a memory opening after formation of a conformal metallic layer on sidewalls of the memory openings and on top active regions of underlying vertical field effect transistors according to an embodiment of the present disclosure.

Referring to FIG. 7, a conformal metallic layer 92L can be deposited on the sidewalls of the memory openings 89 and on top active regions 14T of underlying vertical field effect transistors. Specifically, the conformal metallic layer 92L can be formed on the sidewalls of the alternating stack (32, 60), sidewalls and top surfaces of the insulating cap layers 62, and the top surfaces of the top active regions 14T by a conformal deposition process. The conformal metallic layer 92L can be any suitable electrically conductive material, such as an electrically conductive metal nitride, such as titanium nitride, tantalum nitride, or tungsten nitride, and/or a metal, such as titanium, tantalum, or tungsten, or a combination thereof. The thickness of the conformal metallic layer 92L can be in a range from 3 nm to 100 nm, although lesser and greater thicknesses can also be employed. The inner sidewalls and the outer sidewalls of the conformal metallic layer 92L can be vertical.

Figure 8:
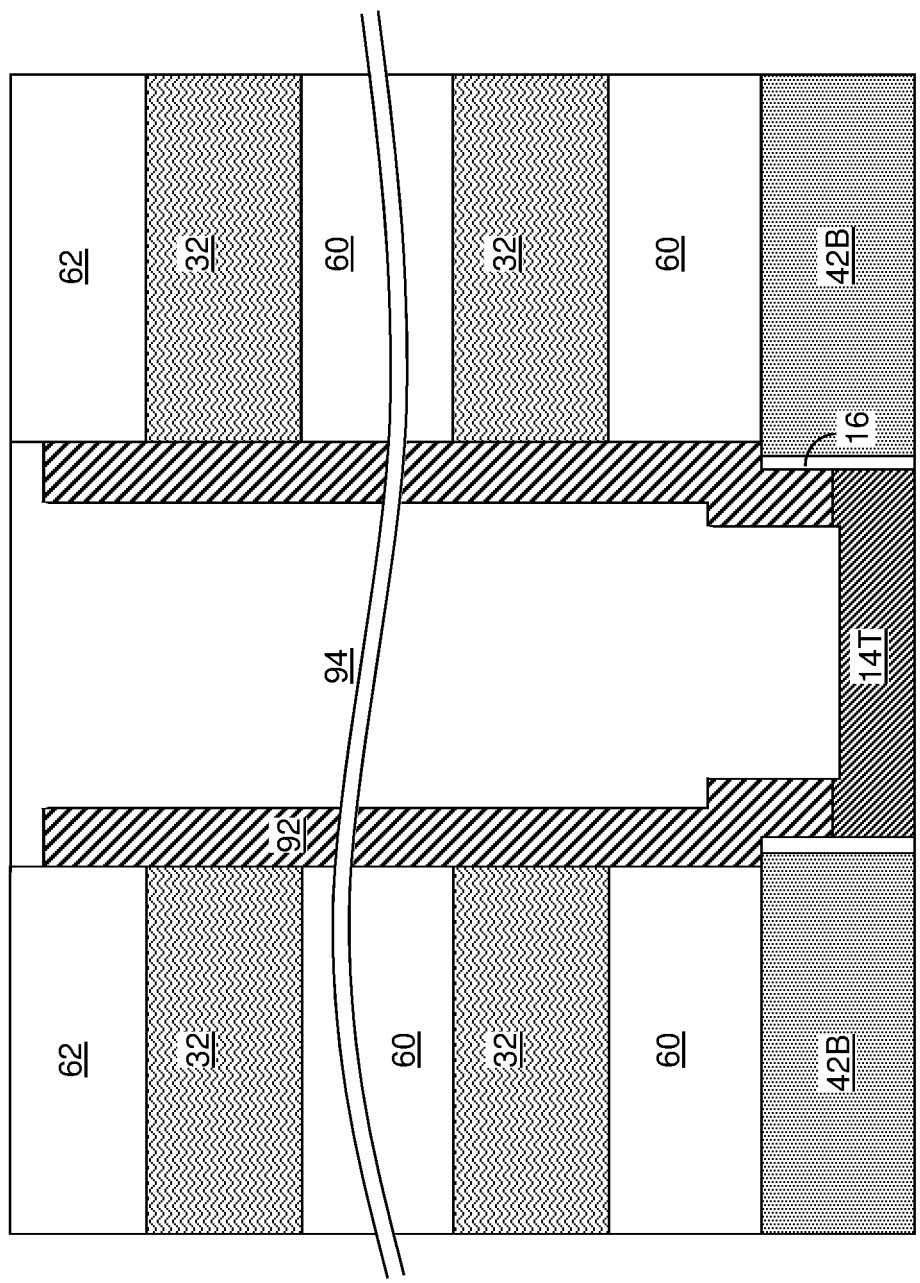
FIG. 8 is a vertical cross-sectional view of a memory opening after formation of vertical conductive lines by patterning the conformal metallic layer and formation of dielectric cores according to an embodiment of the present disclosure.
Figure 9A:
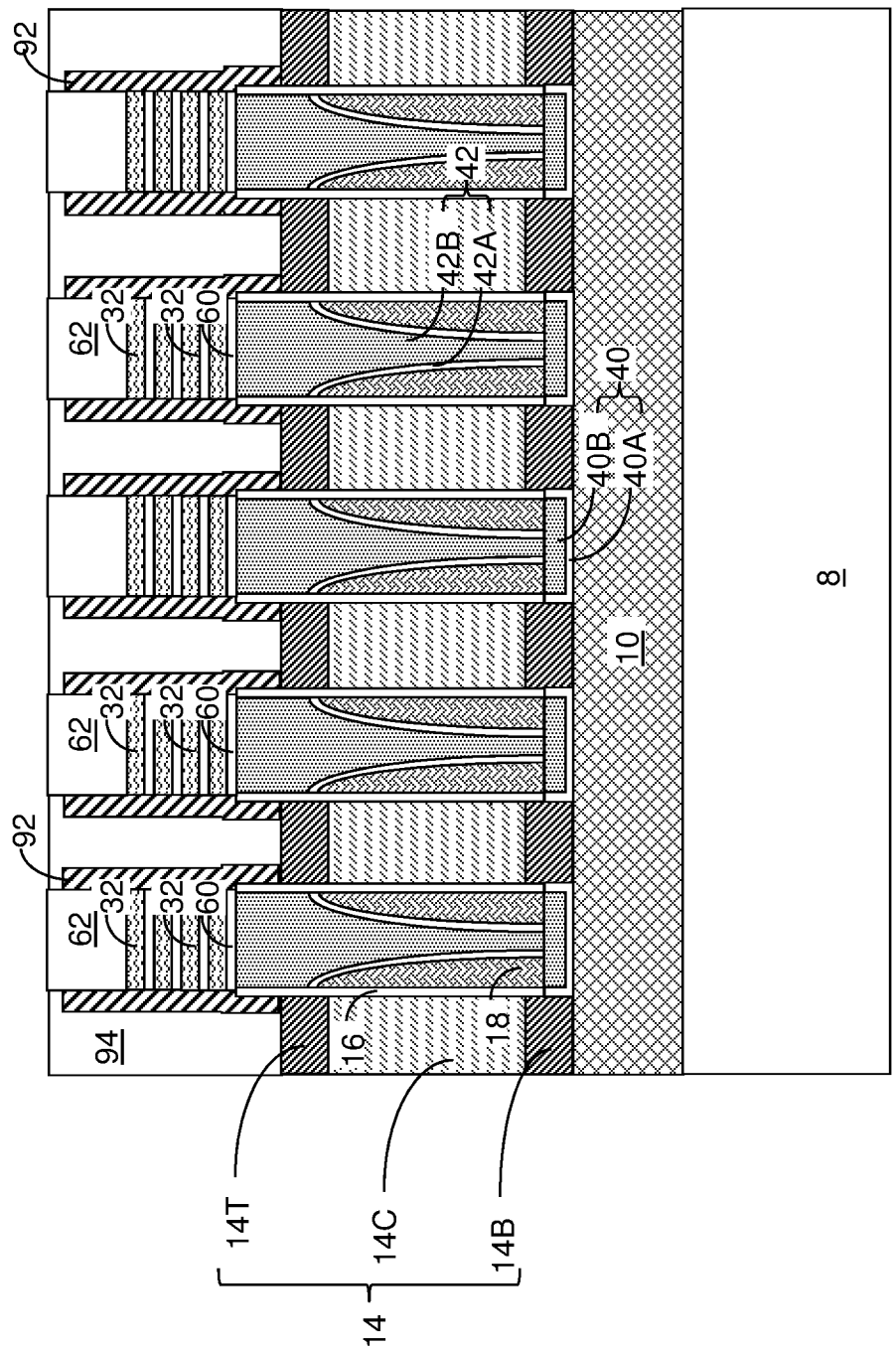
FIG. 9A is a vertical cross-sectional view of the exemplary structure after formation of laterally alternating sequences of vertical conductive lines and dielectric pillar structures that alternate along a first horizontal direction according to an embodiment of the present disclosure.
Figure 9B:
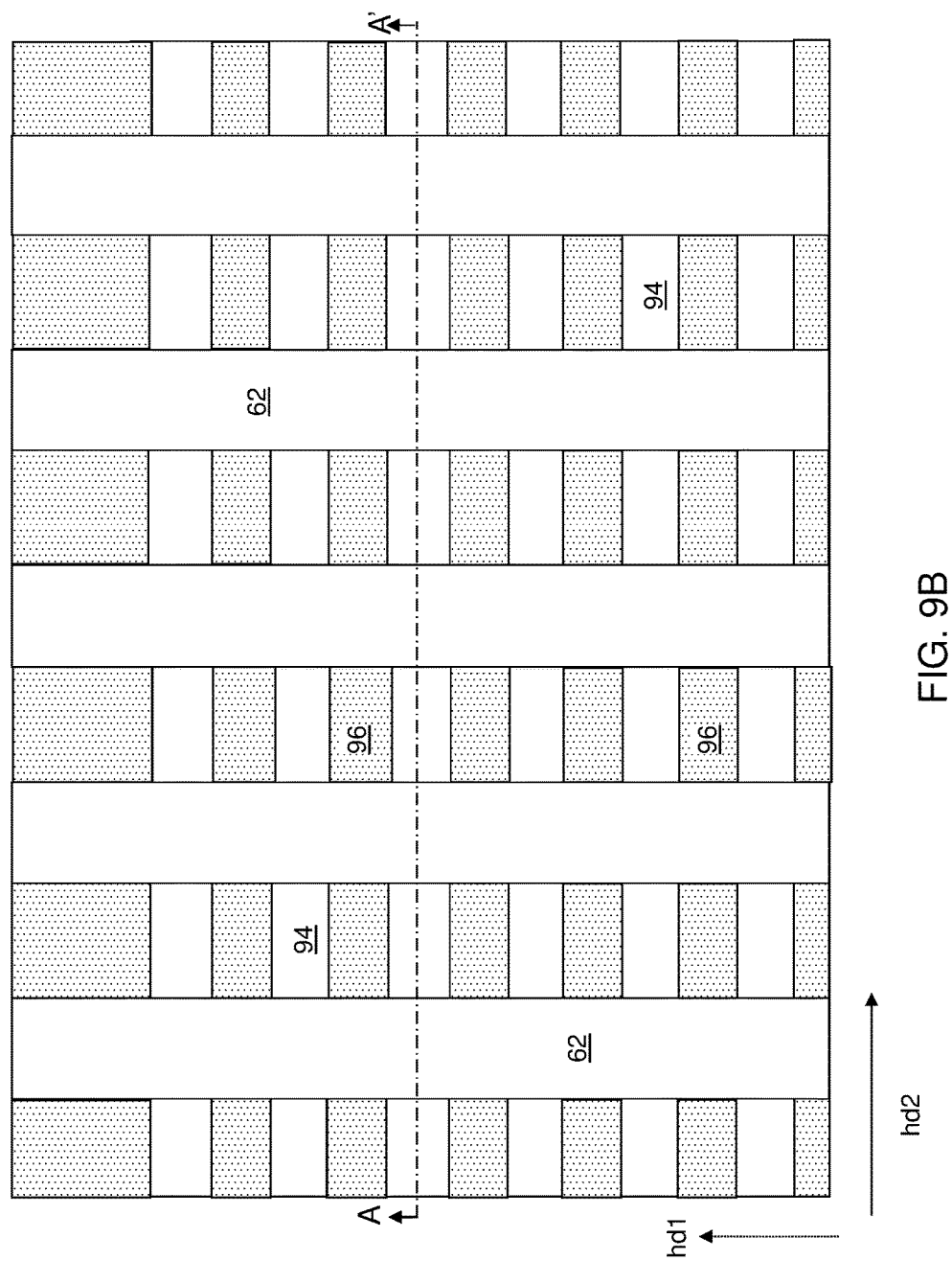
FIG. 9B is a top-down view of the exemplary structure of FIG. 9A. The vertical plane A-A' is the plane of the cross-section for FIG. 9A.

Referring to FIGS. 8, 9A, and 9B, an anisotropic etch is performed to remove horizontal portions of the conformal metallic layer 92L. An opening is formed through the conformal metallic layer 92L at the bottom of each memory cavity (which is an unfilled volume of a respective memory opening 89), and a top surface of an underlying top active region 14T can be physically exposed. Each remaining portion of the conformal metallic layer 92L within a memory opening 89 constitutes a vertical conductive line 92. Each vertical conductive line can be a tubular structure including an opening that extends vertically therethrough. Each vertical conductive line can extend vertically, and can have a horizontal cross-sectional shape that is invariant with the distance from the substrate 8. In one embodiment, the horizontal cross-sectional shape of a vertical conductive line 92 can have a rectangular outer periphery and a rectangular inner periphery that is laterally spaced inward from the rectangular outer periphery by a uniform offset distance, i.e., the thickness of the vertical conductive line 92. In one embodiment, the top surfaces of the vertical conductive lines 92 can be vertically recessed from the horizontal plane including the top surfaces of the insulating cap layer 62.

A dielectric material such as silicon oxide can be deposited in the memory cavities by a conformal deposition process or by spin-coating. Excess portions of the dielectric material can be removed from above the horizontal plane including the top surfaces of the insulating cap layer 62 by a planarization process, which can employ a recess etch or chemical mechanical planarization. Remaining portions of the dielectric material filling the memory cavities constitute dielectric cores 94, which can be pillar-shaped structures having rectangular horizontal cross-sectional shapes. The vertical sidewalls of each dielectric core 94 can be contacted by the inner sidewalls of a respective of one of the vertical conductive lines 92.

Laterally alternating sequences of vertical conductive lines 92 and dielectric pillar structures 96 are formed, which are located on the sidewalls of the alternating stacks (32, 60). Within each laterally alternating sequence, vertical conductive lines 92 and dielectric pillar structures 96 alternate along the first horizontal direction, as shown in FIG. 9B. The laterally alternating sequences are laterally spaced apart among one another along the second horizontal direction by the alternating stacks (32, 60) of sacrificial material layers 32 and insulating layers 60.

While the present disclosure is described employing an embodiment in which a vertical field effect transistor is provided under each vertical conductive line 92, embodiments are expressly contemplated in which a two-dimensional array of vertical field effect transistors are provided over the vertical conductive lines 92, the dielectric pillar structures 96, and the insulating cap layers 62. Generally, a vertical field effect transistor can be provided under, or over, each vertical conductive line 92. An active region of the vertical field effect transistor can be electrically shorted to a top end or a bottom end of the vertical conductive line 92. A row of vertical field effect transistors can underlie, or overlie, a row of vertical conductive lines 92. A column of vertical field effect transistors can underlie, or overlie, a column of vertical conductive lines 92. A two-dimensional array of vertical field effect transistors can underlie, or overlie, a two-dimensional array of vertical conductive lines 92.

Figure 10A:
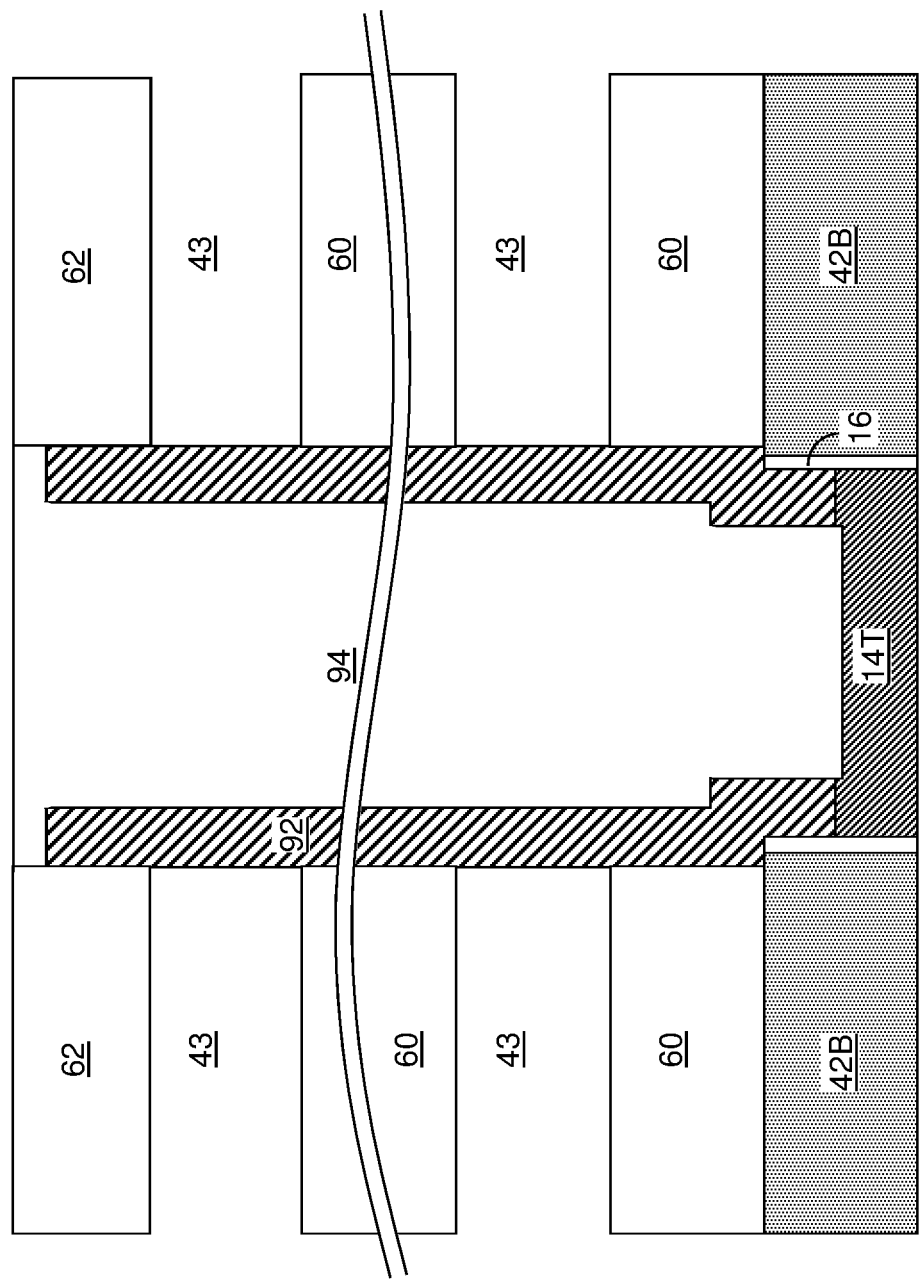
FIG. 10A is a magnified vertical cross-sectional view of a memory region of the exemplary structure after formation of lateral recesses by removal of the sacrificial material layers according to an embodiment of the present disclosure.
Figure 10B:
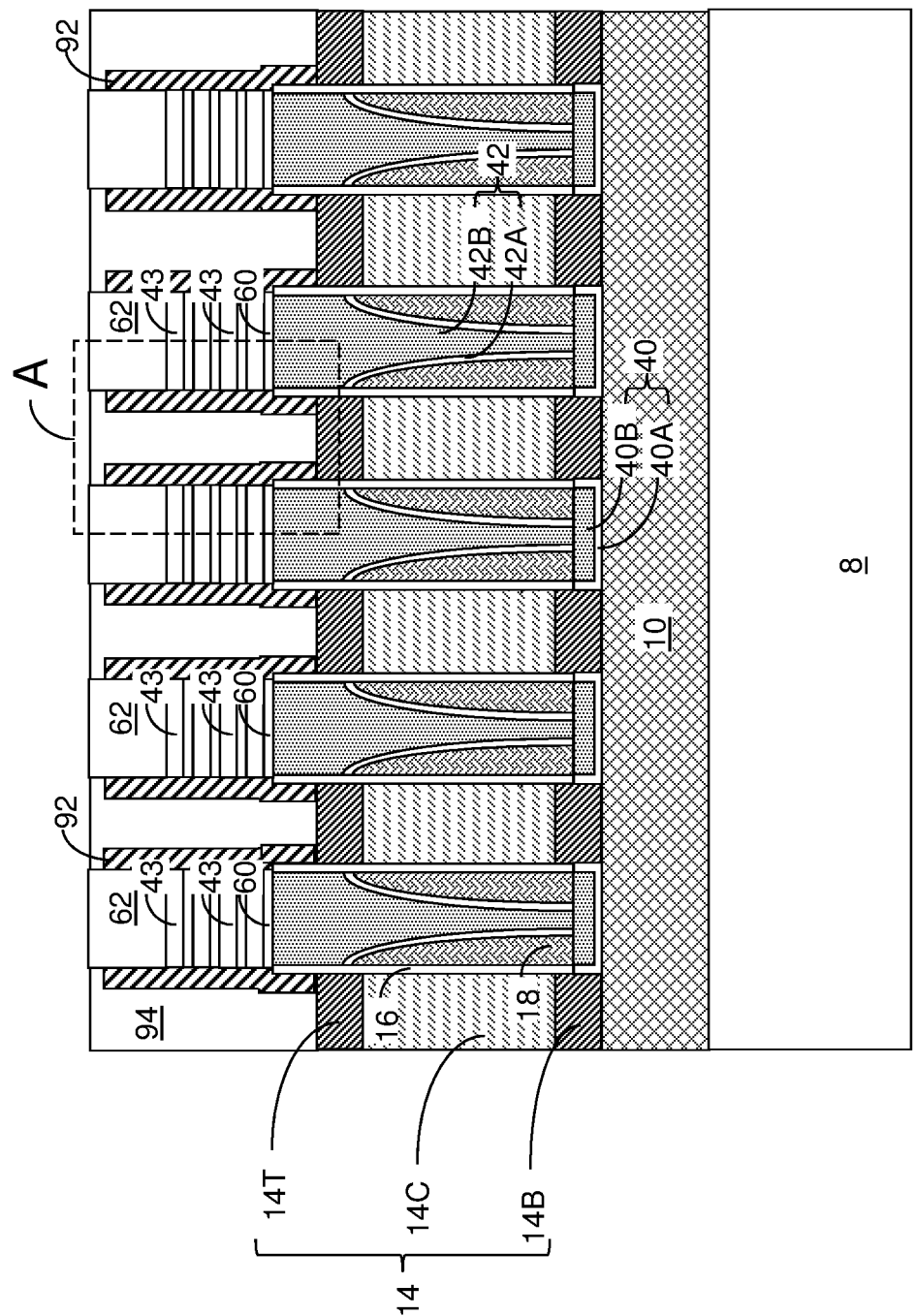
FIG. 10B is a vertical cross-sectional view of the exemplary structure at the processing step of FIG. 10A.
Figure 10C:
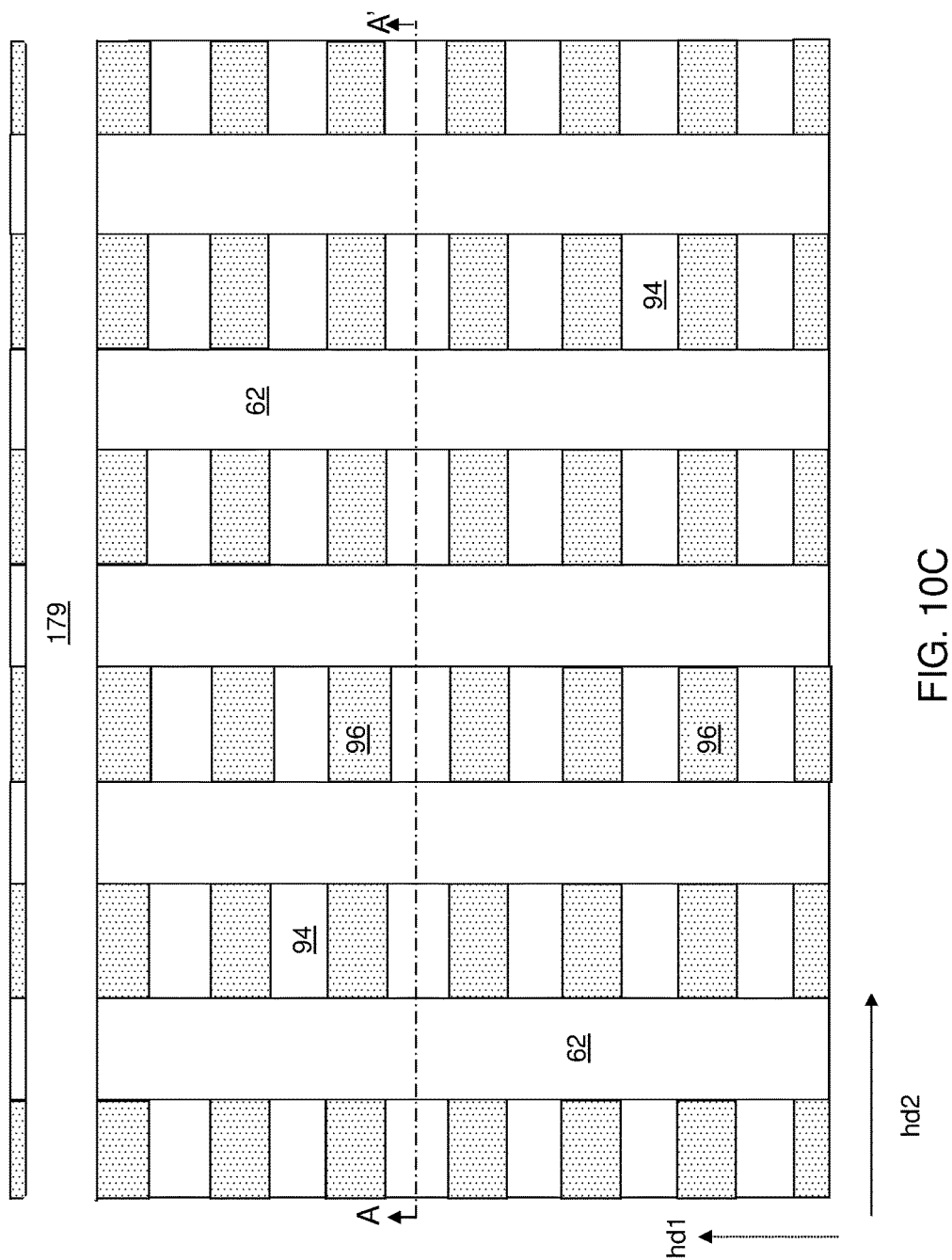
FIG. 10C is a top-down view of the exemplary structure of FIG. 10A. The vertical plane A-A' is the plane of the cross-section for FIG. 10A.

Referring to FIGS. 10A-10C, a photoresist layer (not shown) can be applied over the insulating cap layers 62, the dielectric pillar structures 96, and the dielectric cores 94, and can be lithographically patterned to form at least one opening that overlies plural alternating stacks (32, 60). The opening in the photoresist layer can be an elongated opening that is formed adjacent to the memory array region in which the two-dimensional array of vertical transistors and the two-dimensional array of vertical conductive lines 92 are located. In one embodiment, the elongated opening can overlie portions of the insulating cap layers 62 and the dielectric pillar structures 96 that are adjacent to a periphery of the memory array region that includes the two-dimensional array of vertical field effect transistors and the two-dimensional array of vertical conductive lines 92. The elongated opening in the photoresist layer can have a substantially uniform width throughout. The shape of the elongated opening in the photoresist layer is selected such that the elongated opening straddles each alternating stack (32, 60). Alternatively, a plurality of elongated openings may be employed in lieu of a single elongated opening in the photoresist layer.

An anisotropic etch is performed to transfer the pattern of the photoresist layer through the underlying portions of the insulating cap layers 62, the alternating stacks (32, 60) and the dielectric pillar structures 96 to form at least one backside trench 179. In one embodiment, the backside trench 179 can laterally extend along the second horizontal direction hd2, and can extend through the insulating cap layers 62, each layer within the alternating stacks (32, 60), and the dielectric pillar structures 96. The locations of the backside trench 179 can be selected that the two-dimensional array of vertical field effect transistors does not underlie the backside trench 179, and damage to the vertical field effect transistors can be avoided.

Subsequently, an isotropic etch process that removes the material of the sacrificial material layers 32 selective to the materials of the insulating layers 60, the insulating cap layers 62, the dielectric pillar structures 96, and the vertical conductive lines 92 can be performed. The isotropic etch can be a wet etch process in which an isotropic etchant is provided to the sacrificial material layers 32 through the backside trench 179. In an illustrative example, if the insulating layers 60, the insulating cap layers 62, and the dielectric pillar structures 96 include silicon oxide and if the sacrificial material layers 32 include silicon nitride, a hot phosphoric wet etch can be employed to remove the sacrificial material layers 32 selective to the insulating layers 60, the insulating cap layers 62, the dielectric pillar structures 96, and the vertical conductive lines 92. Lateral recesses 43 are formed by removing the sacrificial material layers 32 selective to the insulating layers 60 and the laterally alternating sequence of the dielectric pillar structures 96 and the vertical conductive lines 92. Metallic surfaces of the vertical conductive lines 92 can be physically exposed to the backside recesses 43. One lateral end of each backside recess 43 is connected to the backside trench 179, and another lateral end of each backside recess 43 is bounded by sidewalls of a row of vertically conductive lines 92 that are laterally spaced apart along the first horizontal direction hd1.

Figure 11A:
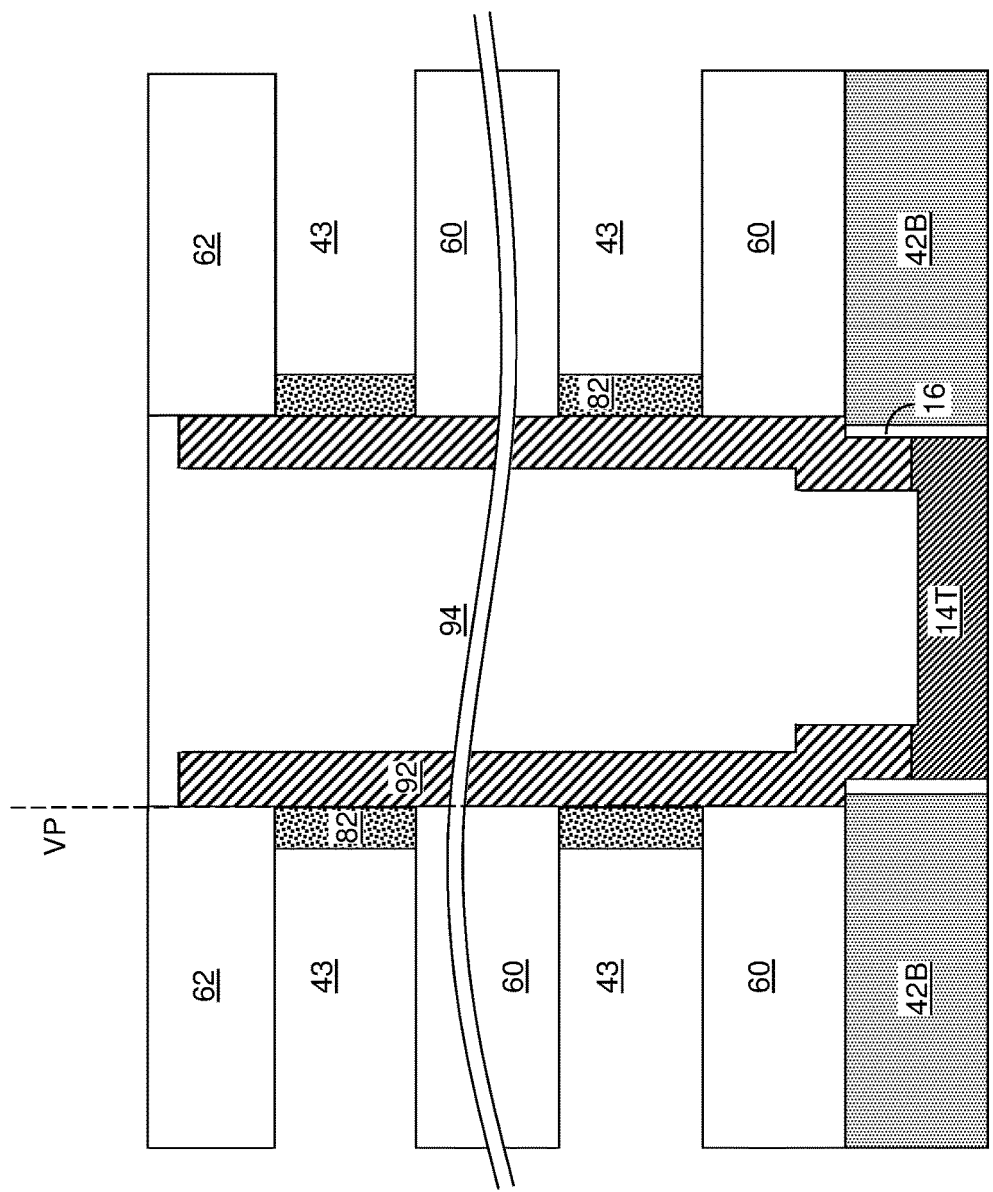
FIG. 11A is a magnified vertical cross-sectional view of the memory region of the exemplary structure after selective deposition of resistive memory material portions according to an embodiment of the present disclosure.
Figure 11B:
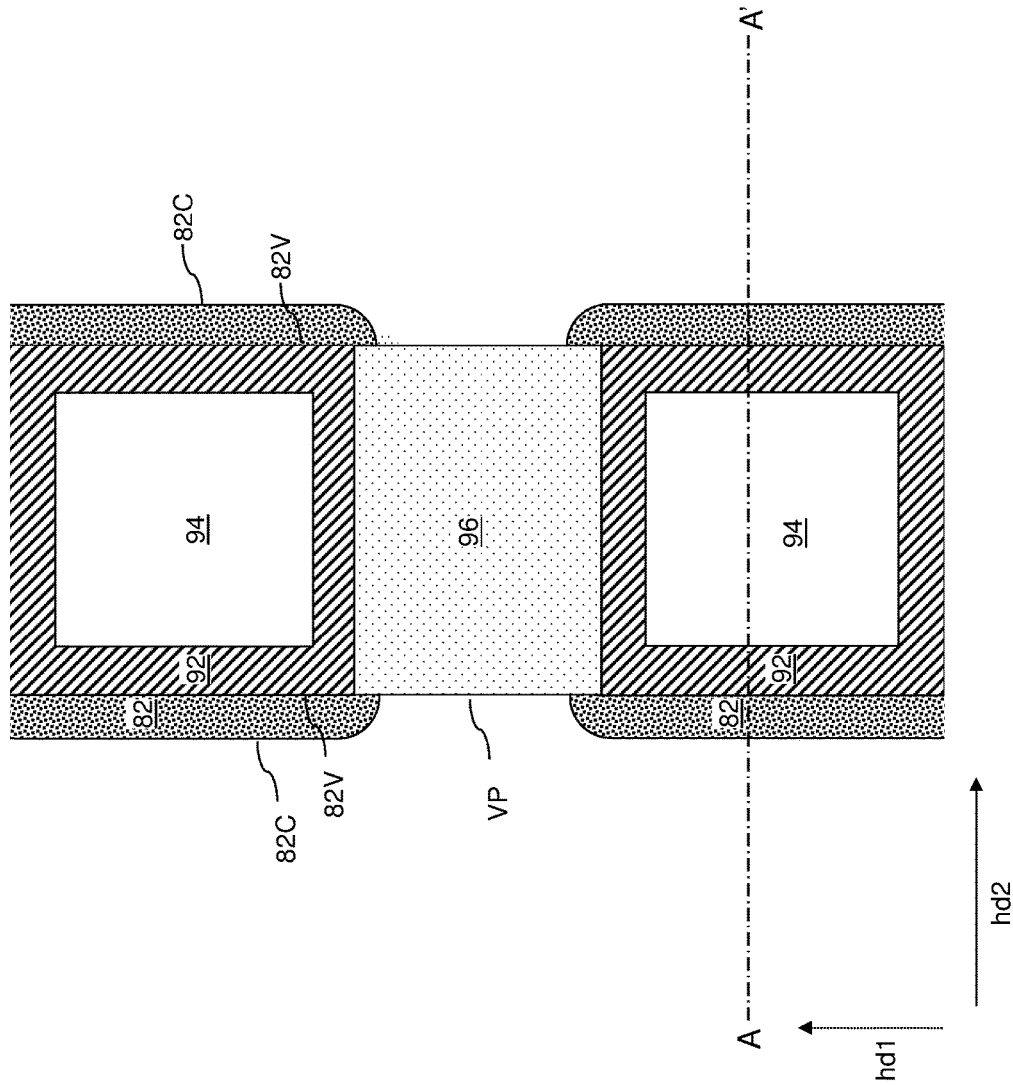
FIG. 11B is a horizontal cross-sectional view along the B-B' plane of FIG. 11A. The vertical plane A-A' is the plane of the vertical cross-section of FIG. 11A.

Referring to FIGS. 11A and 11B, a resistive memory material is deposited on the physically exposed sidewalls of the vertically conductive lines 92 by a selective deposition process. A selective deposition process is a deposition process that proceeds only from a set of surfaces of a specific type and does not proceed from the rest of the surfaces of different types. According to an aspect of the present disclosure, the selective deposition of the resistive memory material can proceed from pre-existing metallic surfaces or surfaces of the resistive memory material formed by the selective deposition process, and not proceed from non-metallic surfaces (such as dielectric surfaces).

In one embodiment, the resistive memory material can include a metal oxide that changes the electrical resistivity among at least two different resistive states. The selective deposition process can be an atomic layer deposition process including an alternating sequence of a metal precursor gas exposure step and an oxidation step. During each metal precursor gas exposure step, pre-existing metallic surfaces or surfaces of the deposited metal oxide material are covered with a monolayer of the metal precursor gas that is adsorbed thereupon. In this case, the duration of each metal precursor gas exposure step can be selected such that the metal precursor gas forms a monolayer on the pre-existing metallic surfaces of the vertical conductive lines 92 or on surfaces of the deposited metal oxide material, and does not form a monolayer of the metal precursor gas for lack of adsorption on pre-existing dielectric surfaces such as the surfaces of the insulating layers 60, the insulating cap layers 62, the dielectric pillar structures 96. Each metal precursor gas exposure step is followed by an oxidation step, in which the adsorbed monolayer of the metal precursor gas on the pre-existing metallic surfaces or surfaces of the deposited metal oxide material is converted into a monolayer of the metal oxide. The selective deposition process deposits the resistive memory material on the physically exposed metallic surfaces of the vertical conductive lines 92, and does not deposit the resistive memory material on dielectric surfaces. Resistive memory material portions 82 are formed on each physically exposed surface of the vertical conductive lines 92. The thickness of each resistive memory material portion 82 can be in a range from 3 nm to 30 nm, although lesser and greater thicknesses can also be employed. In one embodiment, the metal precursor gas can be a titanium-containing metal precursor gas, and the deposited metal oxide can be titanium oxide. In one embodiment, the resistive memory material portion 82 can include a slightly sub-stoichiometric metal oxide such as $TiO_{2-\delta}$, $SrTiO_{3-\delta}$, $NbO_{2-\delta}$, or $Nb:SrTiO_{3\delta}$ where value of $\delta$ can be independently selected from a range from 0 to 0.5, such as greater than zero to 0.15 (i.e., to form a sub-stoichiometric, oxygen deficient metal oxide). For example, the metal oxide material may be titanium oxide, such as sub-stoichiometric titanium oxide having less than two oxygen atoms for each titanium atom. In one embodiment, the metal oxide may have a high concentration of free electrons in thermodynamic equilibrium in a range from $1.0 \times 10^{20}/cm^3$ to $1.0 \times 10^{21}/cm^3$. The resistive memory material portion 82 may be a portion of a barrier modulated cell (BMC) type ReRAM device.

In one embodiment, a two-dimensional array of resistive memory material portions 82 can grow from the physically exposed surfaces of a row of vertical conductive lines 92 that are laterally spaced apart along the first horizontal direction in the lateral recesses 43 that adjoin the row of vertical conductive lines 92. The resistive memory material portions 82 do not grow from surfaces of the insulating layers 60 and the dielectric pillar structures 96. In one embodiment, the two-dimensional array of resistive memory material portions 82 is formed as a periodic two-dimensional array of discrete resistive memory material portions 82 that are laterally spaced among one another along the first horizontal direction hd1 and vertically spaced among one another along a vertical direction perpendicular to the top surface of the substrate 8.

In one embodiment, each resistive memory material portion 82 can grow isotropically from each physically exposed sidewall of the vertical conductive lines 92. In this case, each of the resistive memory material portions 82 can include a vertical sidewall 82V located within a vertical plane including a sidewall of the vertical conductive lines 92, and a contoured sidewall 82C that is curved and not contacting any of the vertical conductive lines 92. Each of the dielectric pillar structures 96 contacting a row of insulating layers 60 can include a sidewall located within the vertical plane VP including the interfaces between vertical sidewall 82V and vertical conductive lines 92.

Figure 12A:
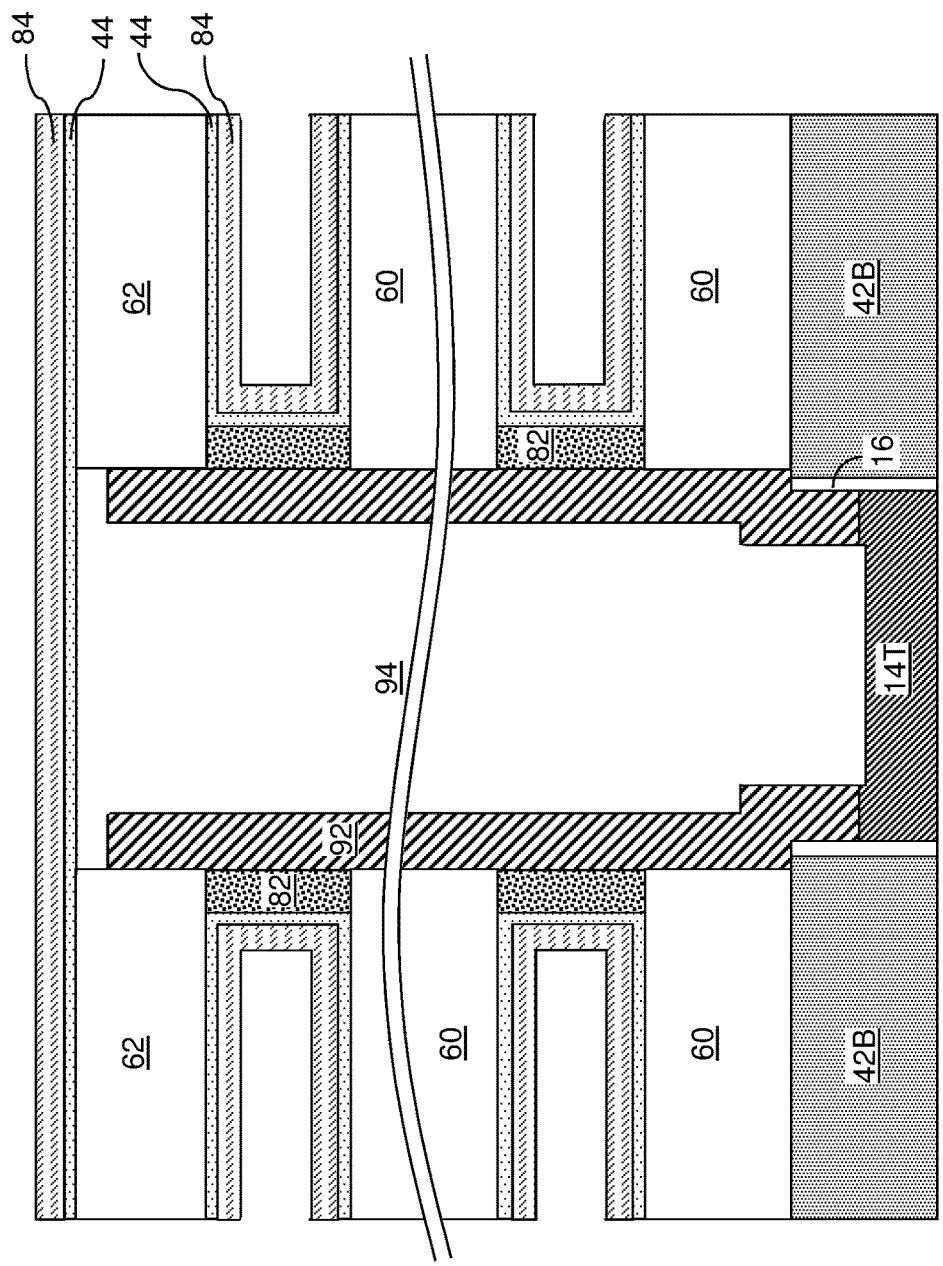
FIG. 12A is a magnified vertical cross-sectional view of the memory region of the exemplary structure after deposition of a conformal dielectric oxide layer and a barrier material layer according to an embodiment of the present disclosure.
Figure 12B:
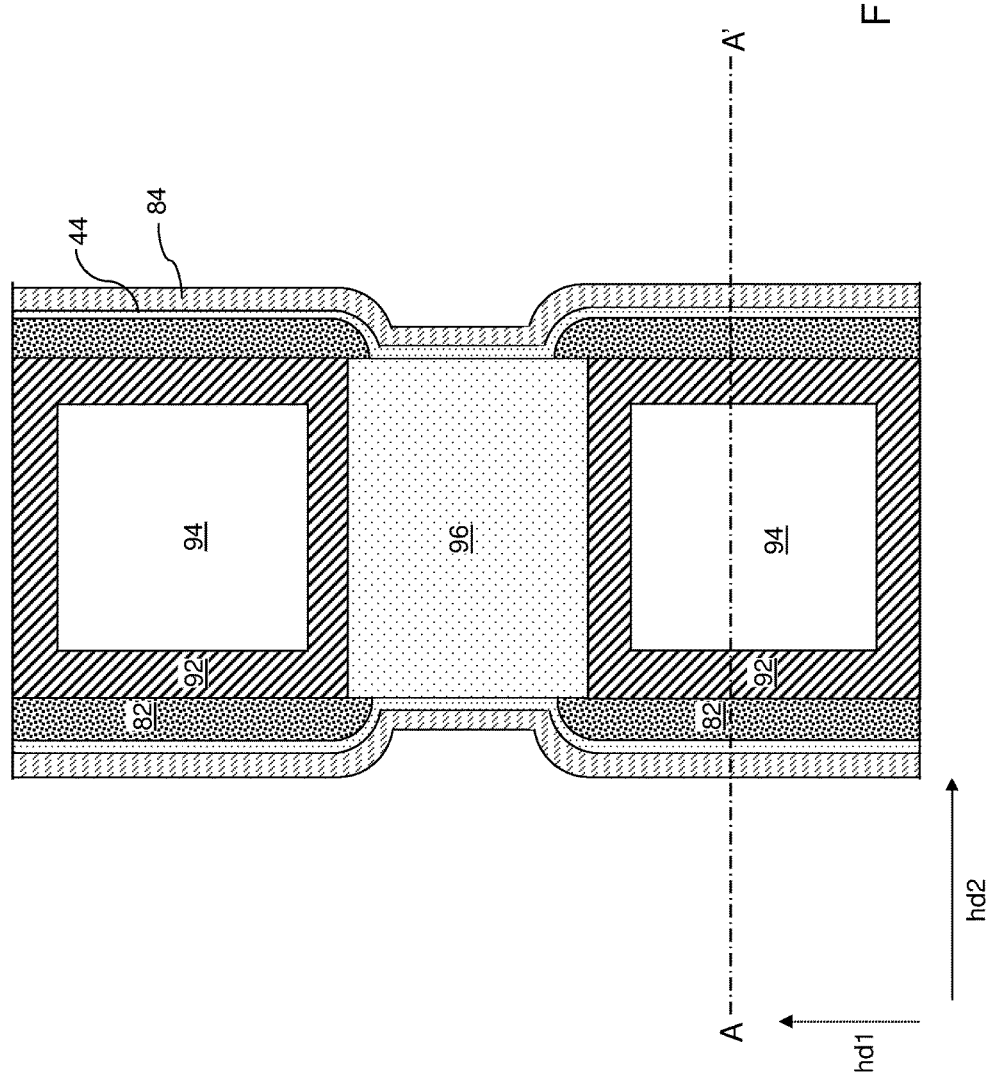
FIG. 12B is a horizontal cross-sectional view along the B-B' plane of FIG. 12A. The vertical plane A-A' is the plane of the vertical cross-section of FIG. 12A.
Figure 13A:
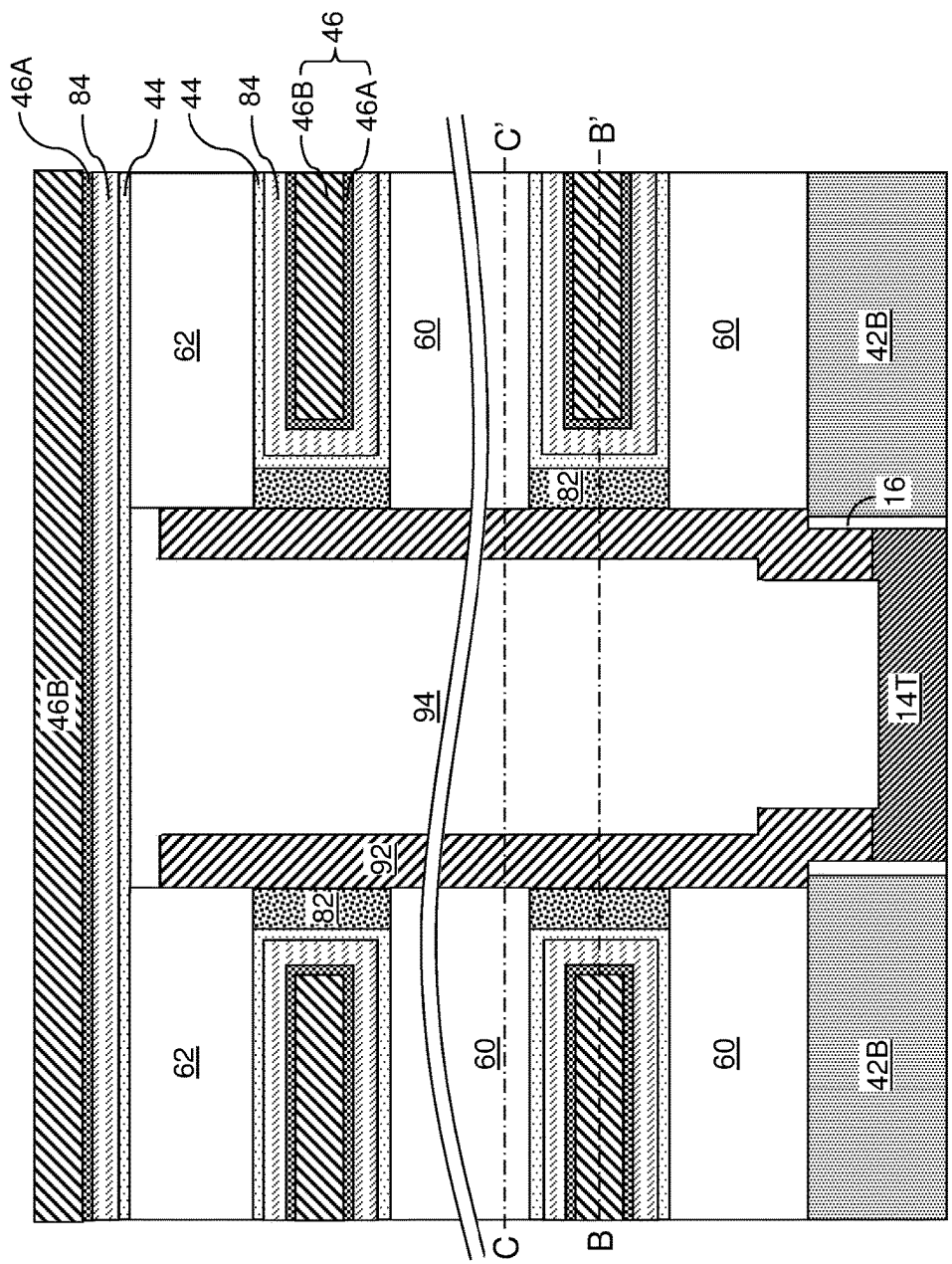
FIG. 13A is a magnified vertical cross-sectional view of the memory region of the exemplary structure after deposition of conductive material layers according to an embodiment of the present disclosure.
Figure 13C:
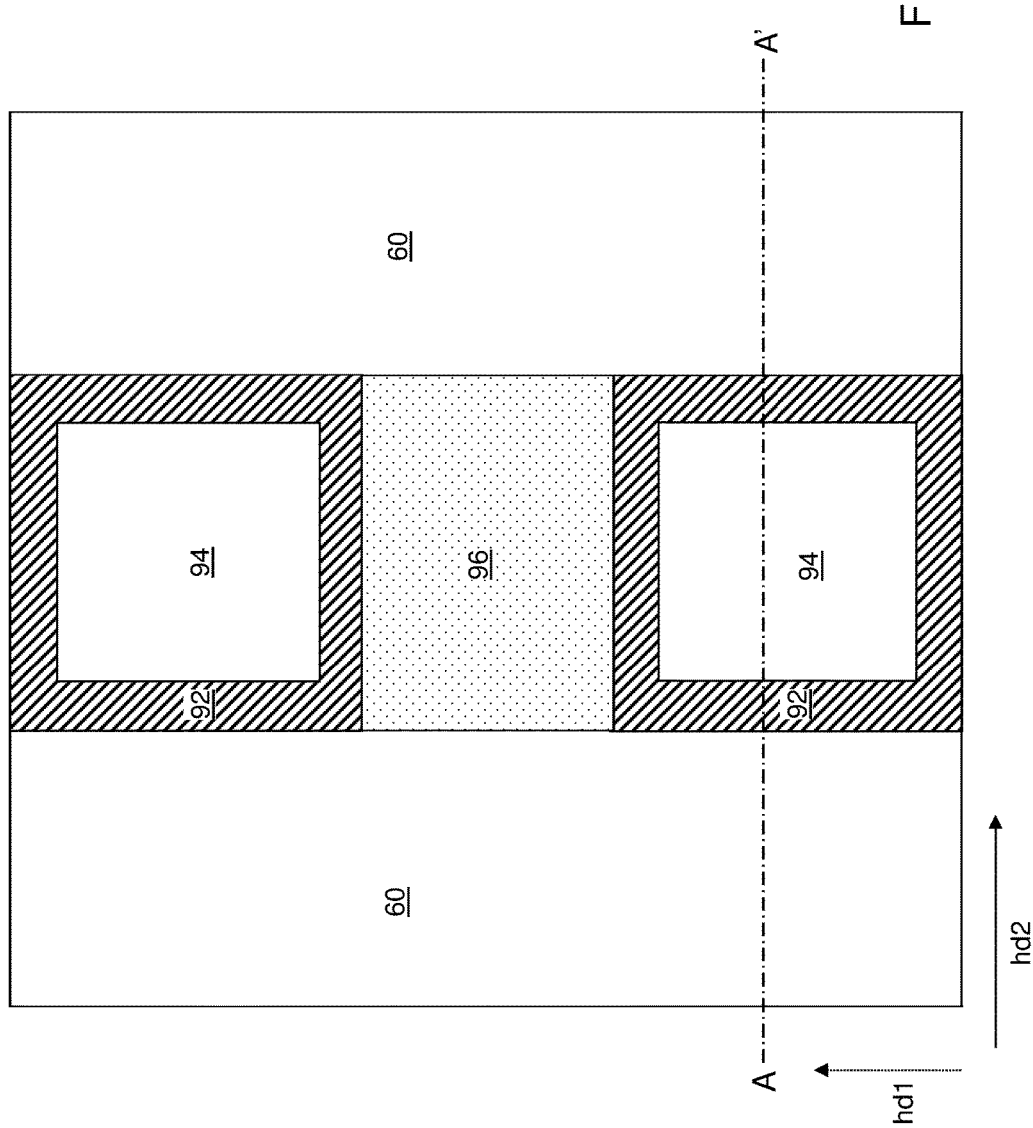
FIG. 13C is a horizontal cross-sectional view along the C-C' plane of FIG. 13A.
Figure 13D:
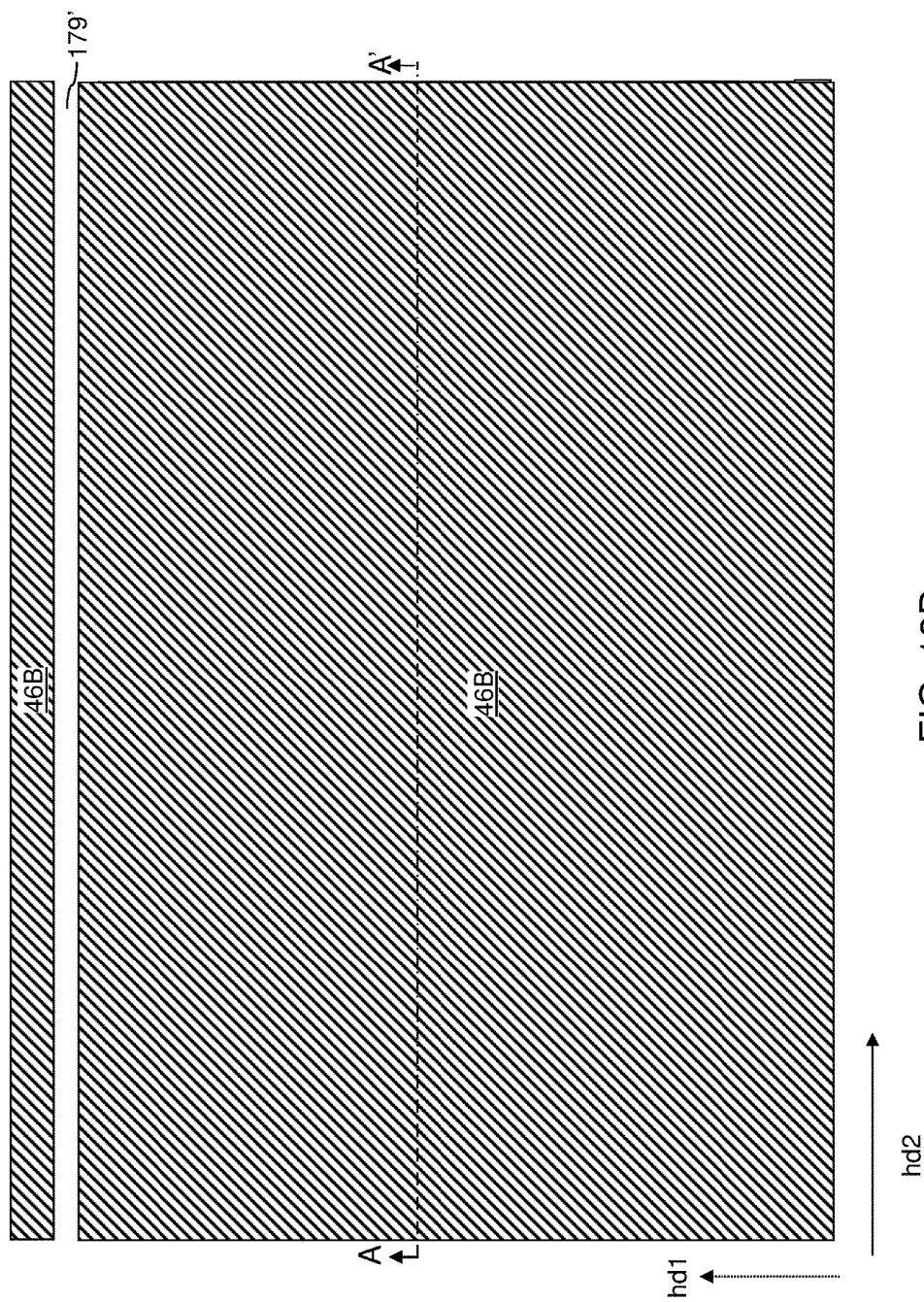
FIG. 13D is a top-down view of the exemplary structure at the processing step of FIGS. 13A-13C.

Referring to FIGS. 12A and 12B, an optional conformal dielectric oxide layer 44 can be deposited on the surfaces of the resistive memory material portions 82 and on the physically exposed surfaces of the insulating layers 60, the insulating cap layers 62, the dielectric pillar structures 96. The optional conformal dielectric oxide layer 44 can be deposited by a non-selective atomic layer deposition process, in which the nucleation time for a precursor gas is sufficient to provide an adsorbed precursor monolayer on all types of underlying surfaces. The optional conformal dielectric oxide layer 44 is laterally spaced from the vertical conductive lines 92 by the two-dimensional array of resistive memory material portions 82, and contacts sidewalls of the dielectric pillar structures 96. The thickness of the optional conformal dielectric oxide layer 44 can be in a range from 1 nm to 6 nm, although lesser and greater thicknesses can also be employed. The optional conformal dielectric oxide layer 44 can include a dielectric metal oxide which function as an interfacial barrier oxide. In one embodiment, the optional conformal dielectric oxide layer 44 can include aluminum oxide.

Subsequently, a barrier material layer 84 is formed on portions of the conformal dielectric oxide layer 44 by a conformal deposition method such as chemical vapor deposition or atomic layer deposition. The barrier material layer 84 is formed over sidewalls of the two-dimensional array of resistive memory material portions 82 in the lateral recesses 43. As used herein, a "barrier material" is an insulating material or a semiconductor material that is provided with a suitable thickness to provide an energy barrier for conduction of electrical current therethrough. Generally, a barrier material composed of an insulating material has a small thickness (which may be, for example, in a range from 1 nm to 2 nm) in order to provide sufficient tunneling current under an electrical bias thereacross, and a barrier material composed of a semiconductor material has a greater thickness (which may be in a range from 2 nm to 20 nm depending on the conductivity that can be modulated by doping with electrical dopants) in order to limit the electrical current therethrough under an electrical bias thereacross.

In one embodiment, the barrier material layer 84 can include, and may consist essentially of, a material selected from amorphous carbon, diamond-like carbon (DLC), an amorphous semiconductor material (e.g., amorphous silicon), and a polycrystalline semiconductor material. Each segment of the barrier material layer 84 that is formed within a backside recess 43 includes a vertical portion that is proximal to a row of resistive memory material portions 82, an upper horizontal portion adjoined to an upper end of the vertical portion, and a lower horizontal portion adjoined to a lower end of the vertical portion. The vertical portion of the barrier material layer 84 can have a laterally undulating profile with a lesser lateral distance to the dielectric pillar structures 96 than a lateral distance to the vertical conductive lines 92 as illustrated in FIG. 12B.

Referring to FIGS. 13A-13D, electrically conductive layers 46 can be formed over the two-dimensional array of resistive memory material portions 82 within the remaining volumes of the lateral recesses 43. For example, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Subsequently, a metal fill material is deposited in the plurality of backside recesses 43, on the sidewalls of the backside trench 179, and over the top surface of the horizontal portion of the metallic barrier layer 46A overlying the insulating cap layers 62 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 60 by the metallic barrier layer 46A (which is a metallic barrier layer that blocks diffusion of fluorine atoms therethrough) and the barrier material layer 84

A plurality of electrically conductive layers 46 can be formed in the plurality of backside recesses 43, and a continuous metallic material layer can be formed on the sidewalls of each backside trench 179 and over the insulating cap layer 62. Each electrically conductive layer 46 includes a portion of the metallic barrier layer 46A and a portion of the metallic fill material layer 46B that are located between a vertically neighboring pair of insulating layers 60 or a topmost insulating layer 62 and the insulating cap layer 62. Each sacrificial material layer 42 can be replaced with an electrically conductive layer 46. A backside cavity 179' is present in the unfilled volume of the backside trench 179.

In one embodiment shown in FIG. 13B, each of the electrically conductive layers 46 has a laterally undulating sidewall including proximal sidewall portions PSP adjacent to the dielectric pillar structures 96 and distal sidewall portions DSP adjacent to the vertical conductive lines 92. A lateral separation distance D1 between each of the distal sidewall portions DSP and a respective most proximate one of the vertical conductive lines 92 is greater than a lateral separation distance D2 between each of the proximal sidewall portions PSP and a respective most proximate one of the dielectric pillar structures 96 by a lateral thickness of the resistive memory material portions 82.

Figure 14A:
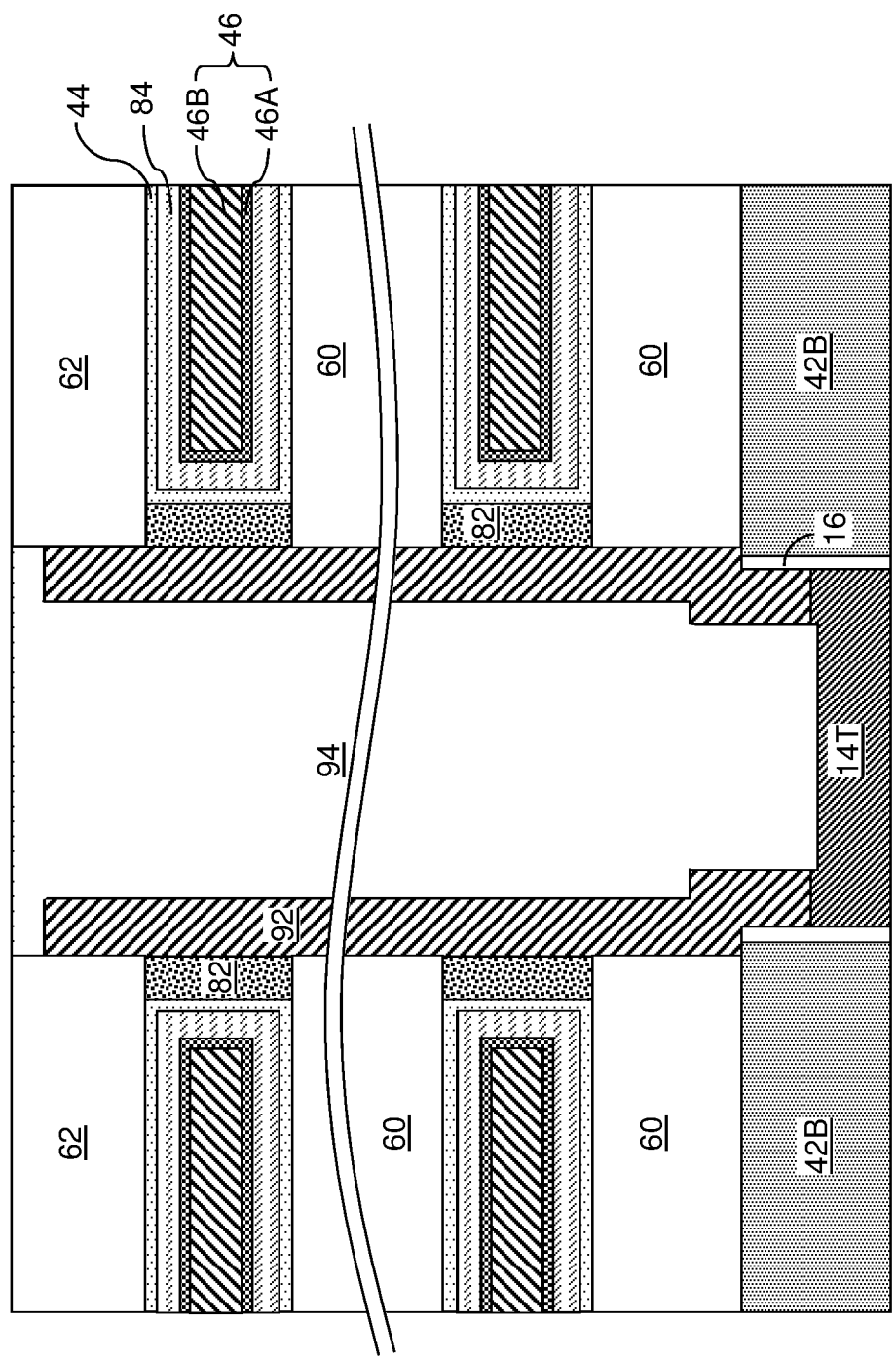
FIG. 14A is a magnified vertical cross-sectional view of the memory region of the exemplary structure after removal of excess materials from above the insulating cap layer and from inside the backside trench and formation of a dielectric fill structure in the backside trench according to an embodiment of the present disclosure.
Figure 14B:
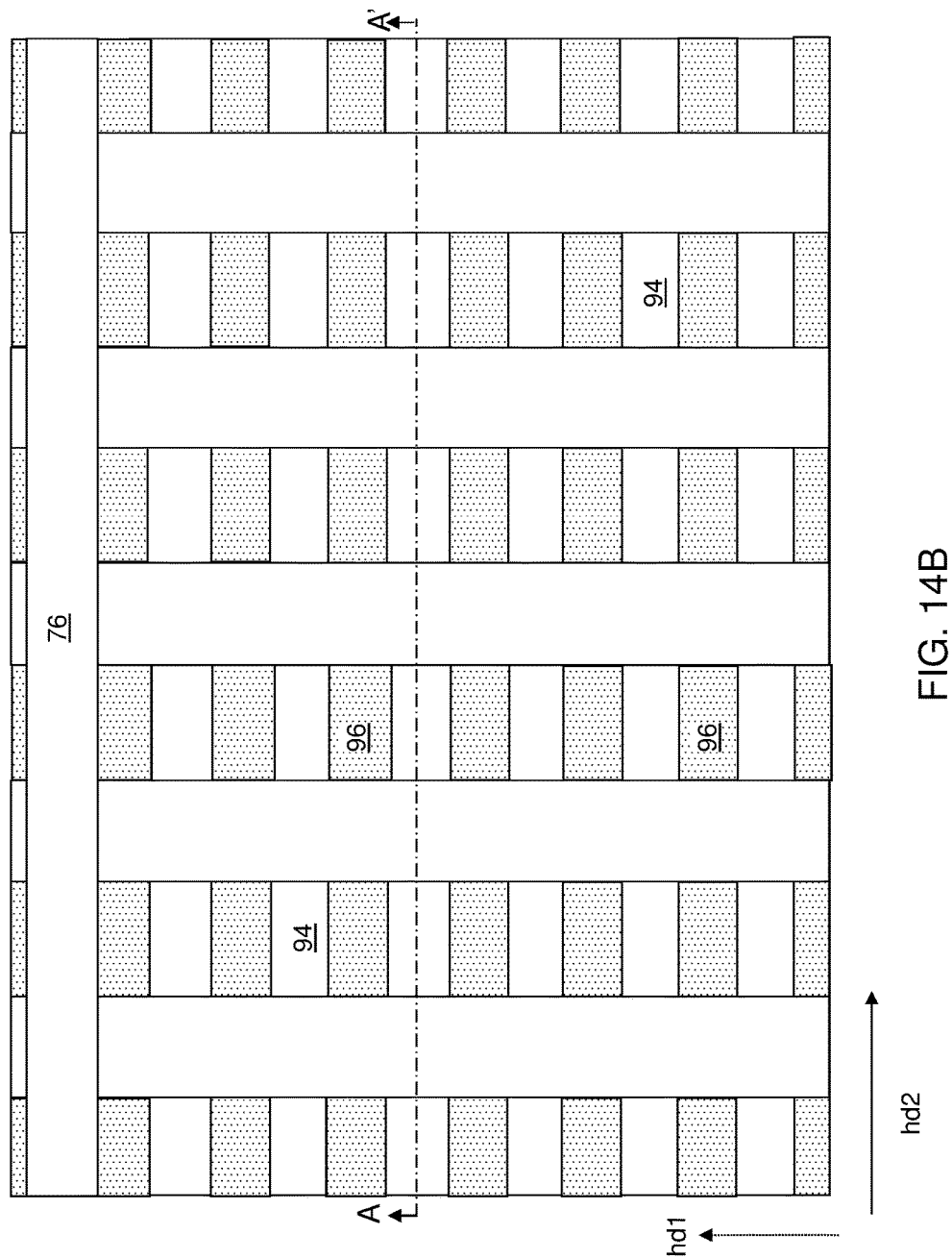
FIG. 14B is a top-down view of the exemplary structure at the processing step of FIG. 14A.

Referring to FIGS. 14A and 14B, the materials of the metallic barrier layer 46A, the metallic fill material layer 46B, and the barrier material layer 84 are etched back from the sidewalls of the backside trench 179 and from above the insulating cap layer 62, for example, by an isotropic wet etch, an anisotropic dry etch, or a combination thereof. Each electrically conductive layer 46 is physically divided among one another, and is electrically isolated among one another. Further, remaining portions of the barrier material layer 84 as originally formed include multiple barrier material layers 84 that are confined within the volume of a respective one of the backside recesses 43. Accordingly, the original barrier material layer 84 is divided into a plurality of barrier material layers 84 that are physically disjoined from one another, and confined between a vertically neighboring pair of insulating layers 60 or between a topmost insulating layer 60 and an insulating cap layer 62.

Each remaining portion of the deposited metallic material in the backside recesses 43 constitutes an electrically conductive layer 46. Each electrically conductive layer 46 can be a conductive line structure. Thus, the sacrificial material layers 32 are replaced with the electrically conductive layers 46. The portions of the optional conformal dielectric oxide layer 44 located within the backside trench 179 and over the insulating cap layers 62 may, or may not, be removed by an etch back process.

Subsequently, a dielectric material is deposited in the backside trench 179 to form a dielectric fill structure 76, which can laterally extend along the second horizontal direction h2 and vertically extend through the alternating stacks (46, 60) of the electrically conductive layers 46 and the insulating layers 60.

Figure 15:
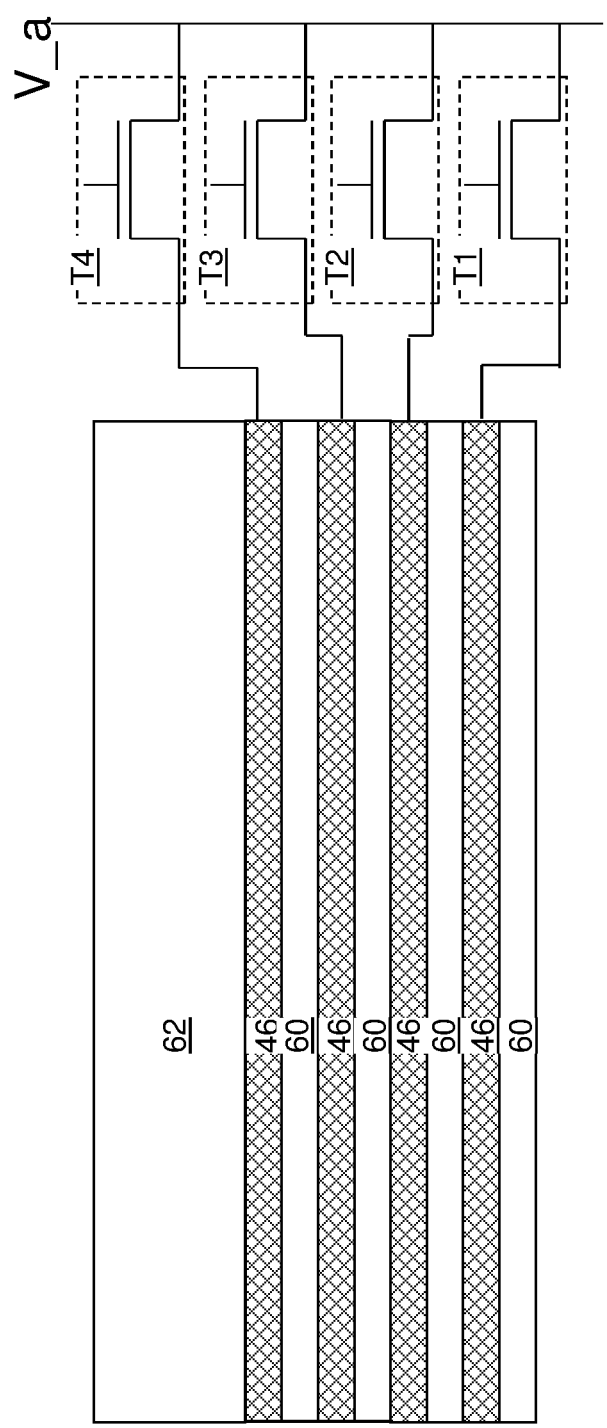
FIG. 15 is a schematic vertical cross-sectional view illustrating access transistors connected to the electrically conductive layers that function as word lines according to an embodiment of the present disclosure.

Referring to FIG. 15, word line select transistors (T1-T4) for selectively activating a respective electrically conductive layer 46 (which functions as a word line) can be formed at any suitable stage of the processing sequence. For example, the word line select transistors can be formed in, or on, the substrate 8 if the substrate 8 includes a semiconductor substrate. Alternatively or additionally, the word line select transistors can be formed prior to, concurrently with, or after formation of the vertical field effect transistors (14, 16, 18). Alternatively or additionally, the word line select transistors can be formed prior to, or after, formation of the vertical conductive lines 92. Any method for forming transistors as known in the art can be employed to provide the second select transistors. A switched node (e.g., a source region or a drain region) of each second select transistor can be connected to an end of a respective electrically conductive layer 46, and another node (e.g., a drain region or a source region) can be connected to a voltage source (or current source) which provides a node activation voltage V_a.

In one embodiment, each global bit line 10 laterally extends along the second horizontal direction hd2, and two or more of the vertical field effect transistors (14, 16, 18) can be electrically connected to the global bit line 10. The vertical field effect transistors (14, 16, 18) are configured to activate a selected vertical conductive line 92 by supplying an activation voltage thereto from a respective global bit line 10, and the word line select transistors (T1-T4) are configured to activate a selected electrically conductive layer 46 by supplying another activation voltage thereto. In one embodiment, the exemplary structure can include a monolithic three-dimensional memory device comprises a resistive random access memory (ReRAM) device.

The electrically conductive layers 46 correspond to the first electrically conductive lines 30 of the resistive random access memory device 500 of FIG. 1, the vertical conductive lines 92 are electrically connected via the vertical transistors (14, 16, 18) to global bit lines 10, which correspond to the second electrically conductive lines 90 of the resistive random access memory device 500 of FIG. 1, and each combination of a resistive memory material portion 82 and proximal portions of the optional conformal dielectric oxide layer 44 and the barrier material layer 84 correspond to the memory cells 180 of FIG. 1.

Without wishing to be bound by a particular theory, it is believed that the BMC ReRAM device described above operates based on the followed principle. The switching mechanism in BMC stack is generally understood as oxygen interstitial (Oi) generation in the interfacial barrier oxide (e.g., aluminum oxide) 44 after a RESET operation (i.e., resetting the stack into the high resistivity state, HRS). The oxygen interstitials may drift into the resistive memory material portion 82, such as a defect rich TiO$_{2-\delta}$ where they cause a re-oxidation of the TiO$_{2-\delta}$ (e.g., recombine with oxygen vacancies in the TiO$_{2-\delta}$ near the interface). This re-oxidation decreases the conductivity of the TiO$_{2-\delta}$ material and/or increases the thickness of the insulating interfacial barrier oxide 44 and hence increases the resistance of the BMC memory cell.

During the SET operation, opposite voltage is applied across the cell, and Ti—O bonds are supposed to be broken down to generate Oi and Vo (oxygen vacancy) pair in the resistive memory material portion 82. Oi may drift back to the interface between the resistive memory material portion 82 and the interfacial barrier oxide 44 along the electric field to increase the conductivity of the TiO$_{2-\delta}$ layer and/or decrease the thickness of the insulating interfacial barrier oxide 44 and hence decrease the resistance of the BMC memory cell to set the memory cell into the low resistivity state, LRS.

Without wishing to be bound by a particular theory, it is believed that a BMC ReRAM device of the embodiments of the present disclosure may operate based on the principle described above and/or based on an alternative principle instead of or in addition to the principle described above. For example, the BMC ReRAM device may operate by modulation of energy band structure within the cell. When the charge carrier density is modulated, the resistance of the cell is changed. In other words, the resistance of the memory cell may be modulated by changes in the band structure and consequent changes in the charge distribution instead of or in addition to the change in thickness of the interfacial barrier oxide 44.

Referring collectively to all figures of the present disclosure and according to an aspect of the present disclosure, a resistive memory device is provided, which comprises: an alternating stack of insulating layers 60 and electrically conductive layers 46 that extend along a first horizontal direction hd1; a laterally alternating sequence of vertical conductive lines 92 and dielectric pillar structures 96 that alternate along the first horizontal direction hd1 and contacting sidewalls of the insulating layers 60; and resistive memory material portions 82 located at intersection regions of the electrically conductive layers 46 and the vertical conductive lines 92.

In one embodiment, each of the electrically conductive layers 42 has a laterally undulating sidewall including proximal sidewall portions adjacent to the dielectric pillar structures 96 and distal sidewall portions adjacent to the vertical conductive lines 92.

In one embodiment, the resistive memory device can further comprise barrier material layers 84 located between each of the electrically conductive layers 46 and a respective row of resistive memory material portions 82. A vertical portion of each barrier material layer 84 has a laterally undulating profile with a lesser lateral distance to the dielectric pillar structures 96 than a lateral distance to the vertical conductive lines 92.

In one embodiment, each barrier material layer 84 comprise an upper horizontal portion overlying a respective one of the electrically conductive layers 46, and a lower horizontal portion underlying the respective one of the electrically conductive layers 46. In one embodiment, each barrier material layer 84 comprises a material selected from amorphous carbon, diamond-like carbon (DLC), an amorphous semiconductor material (e.g., amorphous silicon), and a polycrystalline semiconductor material.

In one embodiment, a conformal dielectric oxide layer 44 is located on each barrier material layer 84, and contacts a row of resistive memory material portions 82. In one embodiment, the conformal dielectric oxide layer 44 is laterally spaced from the vertical conductive lines 92 by the two-dimensional array of resistive memory material portions 82, and contacts sidewalls of the dielectric pillar structures 96.

In one embodiment, the resistive memory material portions 82 comprise sub-stoichiometric titanium oxide, the barrier material layer 84 comprises amorphous silicon, and the conformal dielectric oxide layer 44 comprises aluminum oxide. The vertical conductive lines 92 comprise local vertical bit lines which have a pillar shape, and the electrically conductive layers 46 comprise word lines of a barrier modulated cell of a ReRAM resistive memory device.

In one embodiment, the resistive memory device can further comprise a row of vertical field effect transistors underlying or overlying the vertical conductive lines 92, wherein an active region (such as the top active region 14T) of each of the vertical field effect transistors is electrically shorted to a top end or a bottom end of a respective one of the vertical conductive lines 92.

Because the resistive memory material portions 82 of the present disclosure are formed after formation of the vertical conductive lines 92 and formation of the backside recesses 43, the resistive memory material portions 82 are not subjected to any type of etch. Thus, the resistive memory material portions of 82 of the present disclosure are not collaterally damaged in any subsequent processing step, and thus, the reliability of performance of the resistive memory cells of the present disclosure can be improved compared to resistive memory cells of the prior art that are collaterally damaged after formation.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a resistive memory device, comprising:

forming an alternating stack of insulating layers and sacrificial material layers that extend along a first horizontal direction over a substrate;

forming a laterally alternating sequence of vertical conductive lines and dielectric pillar structures that alternate along the first horizontal direction on sidewalls of the alternating stack;

forming lateral recesses by removing the sacrificial material layers selective to the insulating layers, thereby physically exposing surfaces of the vertical conductive lines in the lateral recesses;

selectively growing resistive memory material portions from physically exposed surfaces of the vertical conductive lines in the lateral recesses, thereby forming a two-dimensional array of resistive memory material portions; and forming electrically conductive layers over the resistive memory material portions in the lateral recesses.

2. The method of claim 1, wherein:

the physically exposed surfaces of the vertical conductive lines comprise metallic surfaces; and the two-dimensional array of resistive memory material portions is grown by performing a selective atomic layer deposition process that deposits a resistive memory material on the metallic surfaces and does not deposit the resistive memory material on any dielectric surfaces.

3. The method of claim 2, wherein:

the metallic surfaces comprise surfaces selected from titanium nitride surfaces, tantalum nitride surfaces, tungsten nitride surfaces, titanium surfaces, tantalum surfaces, and tungsten surfaces; and the resistive memory material portions do not grow from surfaces of the insulating layers and the dielectric pillar structures; and the resistive memory material comprises titanium oxide.

4. The method of claim 1, wherein the resistive memory material portions are formed as a periodic two-dimensional array of discrete resistive memory material portions that are laterally spaced among one another along the first horizontal direction and vertically spaced among one another along a vertical direction.

5. The method of claim 1, wherein:

the resistive memory material comprises sub-stoichiometric titanium oxide;

the vertical conductive lines comprise local vertical bit lines which have a pillar shape;

the resistive memory device comprises a barrier modulated ReRAM resistive memory device; and the electrically conductive layers comprise word lines of a barrier modulated cell of the ReRAM resistive memory device.

6. The method of claim 5, further comprising forming a barrier material layer in the lateral recesses by selectively growing the resistive memory material portions prior to forming the electrically conductive layers, the barrier material layer in the lateral recesses having vertical portions and horizontal portions.

7. The method of claim 6, wherein:

each vertical portion of the barrier material layer in the lateral recesses has a laterally undulating profile with a lesser lateral distance to the dielectric pillar structures than a lateral distance to the vertical conductive lines; and the electrically conductive layers are formed on the barrier material layer within remaining volumes of the lateral recesses.

8. The method of claim 6, further comprising forming a conformal dielectric oxide layer directly on sidewalls of the resistive memory material portions, wherein the barrier material layers are formed on portions of the conformal dielectric oxide layer, wherein the conformal dielectric oxide layer is laterally spaced from the vertical conductive lines by the resistive memory material portions, and contacts sidewalls of the dielectric pillar structures.

9. The method of claim 8, wherein the barrier material layer comprises amorphous silicon and the conformal dielectric oxide layer comprises aluminum oxide.

10. The method of claim 1, further comprising forming a row of vertical field effect transistors underlying or overlying the vertical conductive lines, wherein an active region of each of the vertical field effect transistors is electrically shorted to a top end or a bottom end of a respective one of the vertical conductive lines.

* * * * *